(12) United States Patent
Wang et al.

(10) Patent No.: US 12,433,029 B2
(45) Date of Patent: Sep. 30, 2025

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Benlian Wang, Beijing (CN); Cong Liu, Beijing (CN); Yao Huang, Beijing (CN); Yue Long, Beijing (CN); Jianghua Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/042,669

(22) PCT Filed: Jan. 7, 2022

(86) PCT No.: PCT/CN2022/070822
§ 371 (c)(1),
(2) Date: Feb. 23, 2023

(87) PCT Pub. No.: WO2023/130382
PCT Pub. Date: Jul. 13, 2023

(65) Prior Publication Data
US 2024/0274612 A1 Aug. 15, 2024

(51) Int. Cl.
*H10D 86/60* (2025.01)
*G09G 3/32* (2016.01)
*H10D 86/40* (2025.01)

(52) U.S. Cl.
CPC ........... *H10D 86/60* (2025.01); *H10D 86/441* (2025.01); *G09G 3/32* (2013.01);
(Continued)

(58) Field of Classification Search
CPC ........ H10D 86/60; H10D 86/441; G09G 3/32; G09G 2300/0426; G09G 2300/0819;
(Continued)

(56) References Cited

U.S. PATENT DOCUMENTS

2017/0352311 A1* 12/2017 Lee ...................... G09G 3/3225
2018/0129111 A1* 5/2018 Wu ........................ H10D 86/60
(Continued)

FOREIGN PATENT DOCUMENTS

CN 111445847 A 7/2020
CN 112151592 A 12/2020
(Continued)

OTHER PUBLICATIONS

PCT International Search Report (w/ English translation) and Written Opinion for corresponding PCT Application No. PCT/CN2022/070822, dated Jun. 28, 2022, 9 pages.
(Continued)

*Primary Examiner* — Pegeman Karimi
(74) *Attorney, Agent, or Firm* — Dority & Manning, P.A.

(57) ABSTRACT

A display substrate has a first display region and a second display region, and includes first light-emitting device groups disposed in the first display region, first pixel circuit groups disposed in the second display region, lead groups, and a plurality of second pixel circuits disposed in the second display region. A first light-emitting device group includes N first light-emitting devices. A first pixel circuit group includes N first pixel circuits. A lead group includes N leads, an i-th first light-emitting device is electrically connected to an i-th first pixel circuit through an i-th lead,
(Continued)

and lengths of 1st to N-th leads increase. At least one line of second pixel circuits is disposed between the 1st first light-emitting device and the 1st first pixel circuit. The N leads extend from the first display region to the second display region passing through the at least one line of second pixel circuits.

20 Claims, 14 Drawing Sheets

(52) U.S. Cl.
CPC .............. *G09G 2300/0426* (2013.01); *G09G 2300/0819* (2013.01); *G09G 2300/0842* (2013.01); *G09G 2300/0861* (2013.01)

(58) Field of Classification Search
CPC ... G09G 2300/0842; G09G 2300/0861; G09G 3/3225; H10H 20/857; H01L 25/167; H01L 25/0753; H10K 59/00; H10K 59/12; H10K 50/00; H10K 59/121; H10K 59/131; H10K 59/123; H10K 59/35; H10K 59/65

See application file for complete search history.

(56) References Cited

U.S. PATENT DOCUMENTS

| | | | |
|---|---|---|---|
| 2018/0190190 A1* | 7/2018 | Xi | G09G 3/3208 |
| 2019/0109184 A1* | 4/2019 | Li | G06F 1/163 |
| 2020/0243562 A1* | 7/2020 | Liu | H10D 86/441 |
| 2022/0069047 A1 | 3/2022 | Yang et al. | |

FOREIGN PATENT DOCUMENTS

| | | |
|---|---|---|
| CN | 112186021 A | 1/2021 |
| CN | 113421896 A | 9/2021 |
| CN | 113517324 A | 10/2021 |
| CN | 113539161 A | 10/2021 |
| CN | 113571570 A | 10/2021 |
| CN | 113764501 A | 12/2021 |
| CN | 113809112 A | 12/2021 |
| EP | 4075512 A1 | 10/2022 |

OTHER PUBLICATIONS

Extended European Search Report for corresponding Application No. 2917854.6, dated Jan. 15, 2025, 11 pages.

* cited by examiner

DISPLAY SUBSTRATE AND DISPLAY APPARATUS

CROSS-REFERENCE TO RELATED APPLICATION

This application is a national phase entry under 35 USC 371 of International Patent Application No. PCT/CN2022/070822, filed on Jan. 7, 2022, which is incorporated herein by reference in its entirety.

TECHNICAL FIELD

The present disclosure relates to the field of display technologies, and in particular, to a display substrate and a display apparatus.

BACKGROUND

With the continuous development of science and technologies, users have an increasingly high demand for a screen-to-body ratio of a display apparatus.

In the related technical fields, the concept of full-screen appears. That is, optical elements such as an image collector in the display apparatus are disposed under a display screen.

SUMMARY

In an aspect, a display substrate is provided. The display substrate has a first display region and a second display region. The second display region at least partially surrounds the first display region. The display substrate includes first light-emitting device groups disposed in the first display region, first pixel circuit groups disposed in the second display region, lead groups, and a plurality of second pixel circuits disposed in the second display region. A first light-emitting device group includes N first light-emitting devices; in a direction along a first direction and directed from the second display region to the first display region, the N first light-emitting devices are 1st to N-th first light-emitting devices. A first pixel circuit group includes N first pixel circuits, and 1st to N-th first pixel circuits are arranged in sequence in a direction away from the first display region. A lead group includes N leads arranged in parallel; an i-th first light-emitting device is electrically connected to an i-th first pixel circuit through an i-th lead, and lengths of 1st to N-th leads increase. N is greater than or equal to 2, N is an integer, and i is equal to any of 1 to N. The plurality of second pixel circuits are arranged in a plurality of columns in the first direction and in a plurality of rows in the second direction, the first direction intersects the second direction. At least one line of second pixel circuits is disposed between the 1st first light-emitting device and the 1st first pixel circuit. The N leads extend from the first display region to the second display region passing through the at least one line of second pixel circuits. The at least one line of second pixel circuits includes one of at least one row of second pixel circuits and at least one column of second pixel circuits.

In some embodiments, the first light-emitting device group and the first pixel circuit group electrically connected to the first light-emitting device group are disposed in a same row in the first direction. The at least one column of second pixel circuits is disposed between the 1st first light-emitting device and the 1st first pixel circuit. The N leads extend from the first display region to the second display region passing through the at least one column of second pixel circuits in the first direction.

In some embodiments, the display substrate further includes a plurality of second light-emitting devices disposed in the second display region. A second light-emitting device in the plurality of second light-emitting devices is electrically connected to at least one second pixel circuit in the plurality of second pixel circuits, and an orthogonal projection of the second light-emitting device on a plane where the display substrate is located at least partially overlaps with an orthogonal projection of the at least one second pixel circuit on the plane where the display substrate is located. Alternatively, a second pixel circuit in the plurality of second pixel circuits is electrically connected to at least one second light-emitting device in the plurality of second light-emitting devices, and an orthogonal projection of the second pixel circuit on the plane where the display substrate is located at least partially overlaps with an orthogonal projection of the at least one second light-emitting device on the plane where the display substrate is located. The display substrate includes a plurality of pixel units, each pixel unit includes three sub-pixels arranged in the first direction, and each sub-pixel includes a second light-emitting device and a second pixel circuit that are electrically connected to each other. X second pixel circuits belonging to at least one pixel unit are disposed at intervals between the 1st first light-emitting device and the 1st first pixel circuit, and X is a multiple of 3.

In some embodiments, the display substrate further includes a plurality of second light-emitting devices disposed in the second display region. A second light-emitting device in the plurality of second light-emitting devices is electrically connected to at least one second pixel circuit in the plurality of second pixel circuits, and an orthogonal projection of the second light-emitting device on a plane where the display substrate is located at least partially overlaps with an orthogonal projection of the at least one second pixel circuit on the plane where the display substrate is located. Alternatively, a second pixel circuit in the plurality of second pixel circuits is electrically connected to at least one second light-emitting device in the plurality of second light-emitting devices, and an orthogonal projection of the second pixel circuit on the plane where the display substrate is located at least partially overlaps with an orthogonal projection of the at least one second light-emitting device on the plane where the display substrate is located. The display substrate includes a plurality of pixel units, each pixel unit includes a plurality of sub-pixels, and each sub-pixel includes a second light-emitting device and a second pixel circuit that are electrically connected to each other. The arrangement manner of the plurality of pixel units is a Pentile arrangement. Y second pixel circuits belonging to at least one pixel unit are disposed at intervals between the 1st first light-emitting device and the 1st first pixel circuit, and Y is a multiple of 2.

In some embodiments, a sequence constituted by values of lengths of the N leads in the first direction is an arithmetic sequence.

In some embodiments, a sequence constituted by values of resistances of the N leads is an arithmetic sequence.

In some embodiments, a parasitic capacitance is generated between each lead and at least one second pixel circuit through which the lead passes, or between each lead and at least one first pixel circuit through which the lead passes, or between each lead and both the at least one second pixel circuit and the at least one first pixel circuit through which the lead passes. A sequence constituted by values of parasitic capacitances generated by the N leads is an arithmetic sequence.

In some embodiments, all first light-emitting devices located in the first display region constitute a plurality of rows of first light-emitting devices, each row of first light-emitting devices is divided into two first light-emitting device groups located at two sides of a reference line. The reference line is a straight line extending in the second direction and passing through the first display region, the second direction is perpendicular to the first direction. Two first pixel circuit groups respectively electrically connected to the two first light-emitting device groups are located at two opposite sides of the first display region in the first direction. Two lead groups respectively electrically connected to the two first light-emitting device groups are located at the two sides of the reference line.

In some embodiments, the two lead groups respectively electrically connected to the two first light-emitting device groups are symmetrically disposed with respect to the reference line.

In some embodiments, the first display region has a center, and the reference line is the straight line passing through the center.

In some embodiments, the first light-emitting device group and the first pixel circuit group electrically connected to the first light-emitting device group are disposed in a same row in the first direction. The display substrate further includes transfer hole groups, a transfer hole group includes N transfer holes, the N transfer holes are arranged in sequence in the first direction and correspond to the N first light-emitting devices respectively. In the second direction, the i-th lead electrically connected to the i-th first light-emitting device is closer to the transfer hole group than an (i+1)-th lead electrically connected to an (i+1)-th first light-emitting device. The second direction is perpendicular to the first direction.

In some embodiments, the first light-emitting device group and the first pixel circuit group electrically connected to the first light-emitting device group are disposed in a same row in the first direction. The display substrate further includes transfer hole groups, a transfer hole group includes N transfer holes, the N transfer holes are arranged in sequence in the first direction and correspond to the N first light-emitting devices respectively. The i-th lead electrically connected to the i-th first light-emitting device and an (i+1)-th lead electrically connected to an (i+1)-th first light-emitting device are located at two opposite sides of the transfer hole group in the second direction. The second direction is perpendicular to the first direction.

In some embodiments, the display substrate includes a substrate; a pixel circuit layer disposed on the substrate, the first pixel circuit groups and the plurality of second pixel circuits being located in the pixel circuit layer; a light-emitting device layer disposed at a side of the pixel circuit layer away from the substrate, the first light-emitting device groups being located in the light-emitting device layer; and a plurality of lead layers disposed between the pixel circuit layer and the light-emitting device layer, a material of the plurality of lead layers including a light transmissive conductive material. The N leads in the lead group are located in the plurality of lead layers.

In some embodiments, a number of the plurality of lead layers is two. In the 1st to N-th leads in the N leads, odd-numbered leads and even-numbered leads are respectively arranged in the two lead layers.

In some embodiments, in the N leads, a ratio of a length of the N-th lead to a length of the 1st lead is $\alpha$, and $\alpha$ is less than or equal to 25 ($\alpha \leq 25$).

In some embodiments, the ratio $\alpha$ satisfies that $\alpha$ is less than or equal to 15 ($\alpha \leq 15$).

In some embodiments, a number of rows or columns of second pixel circuits disposed at intervals between the 1st first light-emitting device and the 1st first pixel circuit is $\beta$, and $\beta$ is less than or equal to 30 ($\beta \leq 30$).

In some embodiments, a ratio of a number of rows or columns of pixel circuits disposed at intervals between the N-th first light-emitting device and the N-th first pixel circuit to a number of rows or columns of second pixel circuits disposed at intervals between the 1st first light-emitting device and the 1st first pixel circuit is $\gamma$, and $\gamma$ is greater than or equal to 5 and less than or equal to 50 ($5 \leq \gamma \leq 50$). The pixel circuits disposed between the N-th first light-emitting device and the N-th first pixel circuit include first pixel circuits and second pixel circuits.

In some embodiments, the second display region includes a normal region and a compression region. The first pixel circuit groups are located in the compression region, a part of the plurality of second pixel circuits are located in the normal region, and a remaining part of the plurality of second pixel circuits are located in the compression region. In the compression region, at least one second pixel circuit is disposed between two adjacent first pixel circuits in the first direction. A width of a column region in which a first pixel circuit or a second pixel circuit in the compression region is located is less than a width of a column region in which a second pixel circuit in the normal region is located.

In another aspect, a display apparatus is provided. The display apparatus includes the display substrate according to any of the above embodiments, and an optical element disposed on a non-light exit side of the display substrate, the optical element is located under the first display region of the display substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings to be described below may be regarded as schematic diagrams, but are not limitations on an actual size of a product involved in the embodiments of the present disclosure.

DETAILED DESCRIPTION

Figure 1:
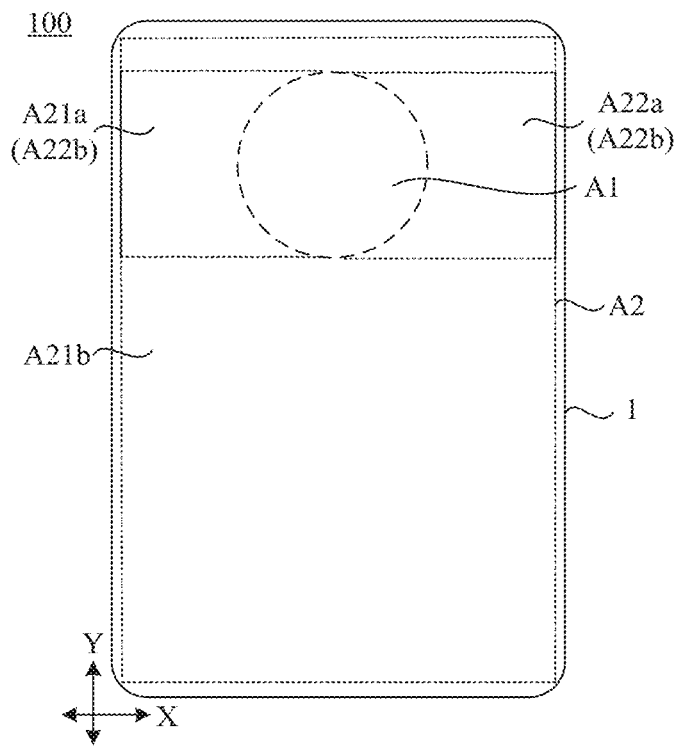
FIG. 1 is a structural diagram of a display substrate, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting that", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phrase "applicable to" or "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Transistors used in circuits provided by the embodiments of the present disclosure may be thin film transistors, field effect transistors or other switching devices with the same characteristics, and the thin film transistors are all used as an example in the embodiments of the present disclosure for description.

In the embodiments, a control electrode of each transistor used in each circuit is a gate of the transistor, a first electrode of the transistor is one of a source and a drain of the transistor, and a second electrode of the transistor is the other of the source and the drain of the transistor. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided by the embodiments of the present disclosure, node(s) do not represent actual components, but represent junctions of related electrical connections in a circuit diagram. That is, these nodes are nodes equivalent to the junctions of the related electrical connections in the circuit diagram.

The transistors included in each circuit provided by the embodiments of the present disclosure may be all N-type transistors or all P-type transistors. Alternatively, some transistors included in each circuit may be N-type transistors, and the other transistors may be P-type transistors.

In the embodiments of the present disclosure, an "effective level" refers to a level at which the transistor may be turned on.

Hereinafter, in the circuits provided by the embodiments of the present disclosure, the description will be made by considering an example in which the transistors are all P-type transistors (in this case, the effective level is a low level). It will be noted that, the transistors in each circuit mentioned below have a same conduction type, which may simplify process flow, reduce process difficulty, and improve a yield of products (e.g., display substrates 100 or display apparatuses 1000).

Some embodiments of the present disclosure provide a display substrate 100. As shown in FIG. 1, the display substrate 100 has a first display region A1 and a second display region A2, and the second display region A2 at least partially surrounds the first display region A1. For example, an area of the second display region A2 is greater than an area of the first display region A1.

Here, there may be at least one first display region A1, and there may be, for example, one second display region A2. As shown in FIG. 1, the structure of the display substrate 100 will be schematically described below by considering an example where there is one first display region A1.

For example, the second display region A2 may surround the first display region A1. In this case, a shape of the first display region A1 may be, for example, a circle, an ellipse, or a rectangle.

For example, the second display region A2 may be at a periphery of a part of the first display region A1. That is, a part of an edge of the second display region A2 overlaps with a part of an edge of the first display region A1. In this case, the shape of the first display region A1 may be, for example, a rectangle, a rounded rectangle, a drop or a semicircle.

Figure 2:
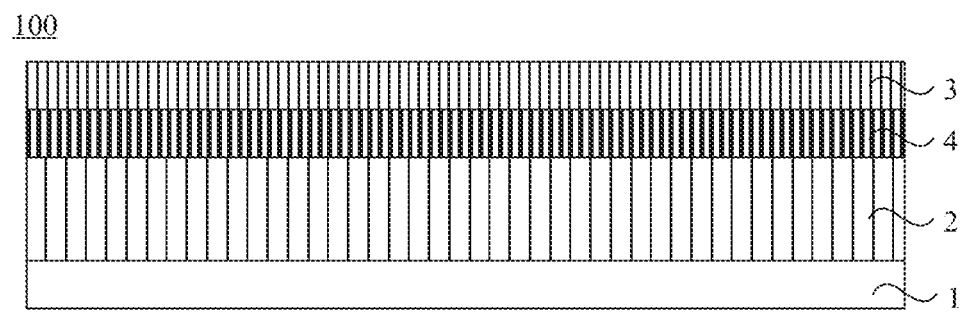
FIG. 2 is a structural diagram of another display substrate, in accordance with some embodiments of the present disclosure.

In some examples, as shown in FIG. 2, the display substrate 100 may include a substrate 1.

A type of the substrate 1 varies and may be set according to actual needs.

For example, the substrate 1 may be a rigid substrate. The rigid substrate may be a glass substrate, a polymethyl methacrylate (PMMA) substrate, or the like.

For example, the substrate 1 may be a flexible substrate. The flexible substrate may be a polyethylene terephthalate (PET) substrate, a polyethylene naphthalate two formic acid glycol ester (PEN) substrate, a polyimide (PI) substrate, or the like. In this case, for example, the display substrate 100 may achieve flexible display.

In some examples, as shown in FIGS. 2 to 6, the display substrate 100 may further include a pixel circuit layer 2 disposed on the substrate 1.

Figure 3:
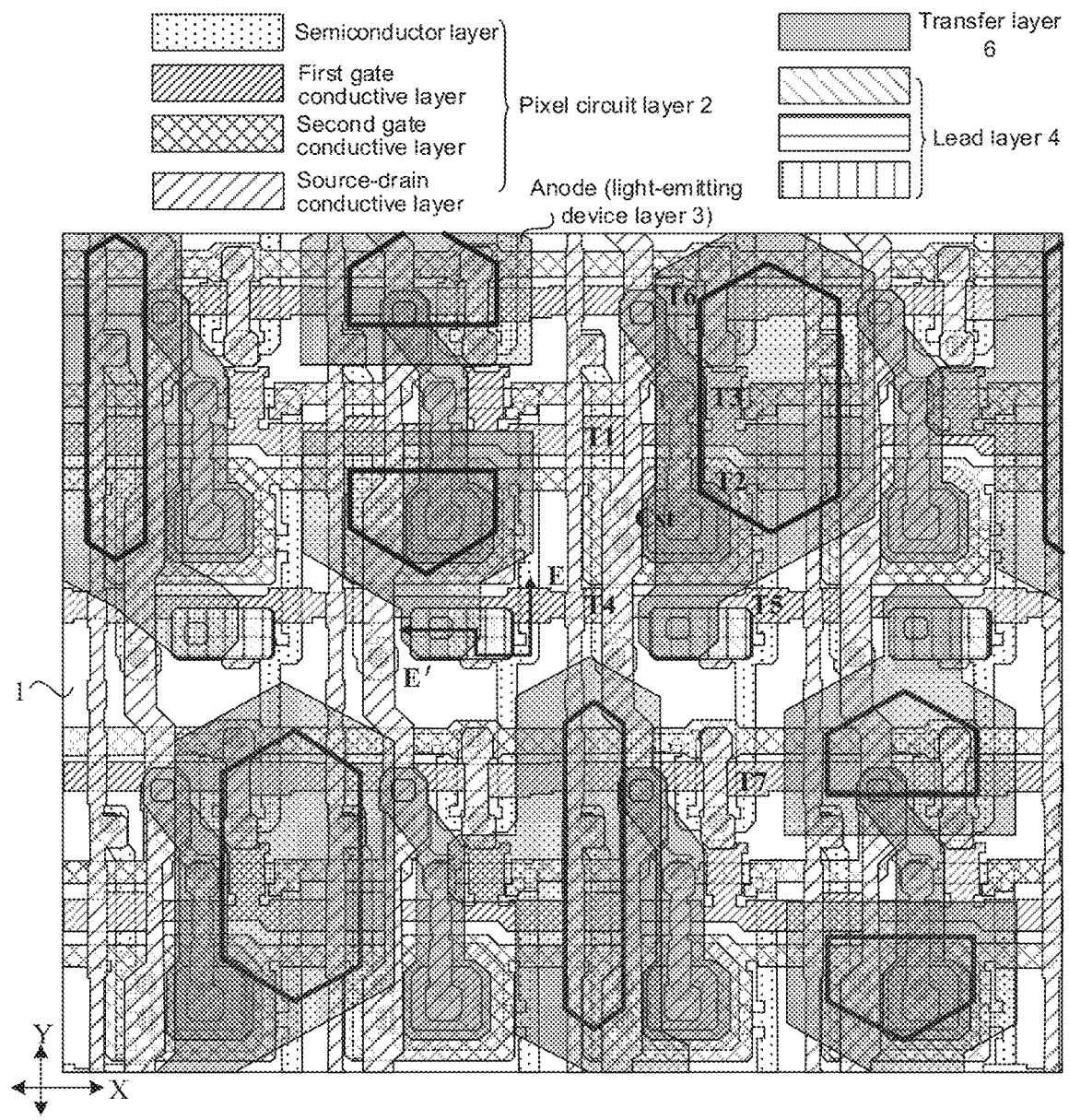
FIG. 3 is an enlarged partial view of a display substrate, in accordance with some embodiments of the present disclosure.
Figure 5:
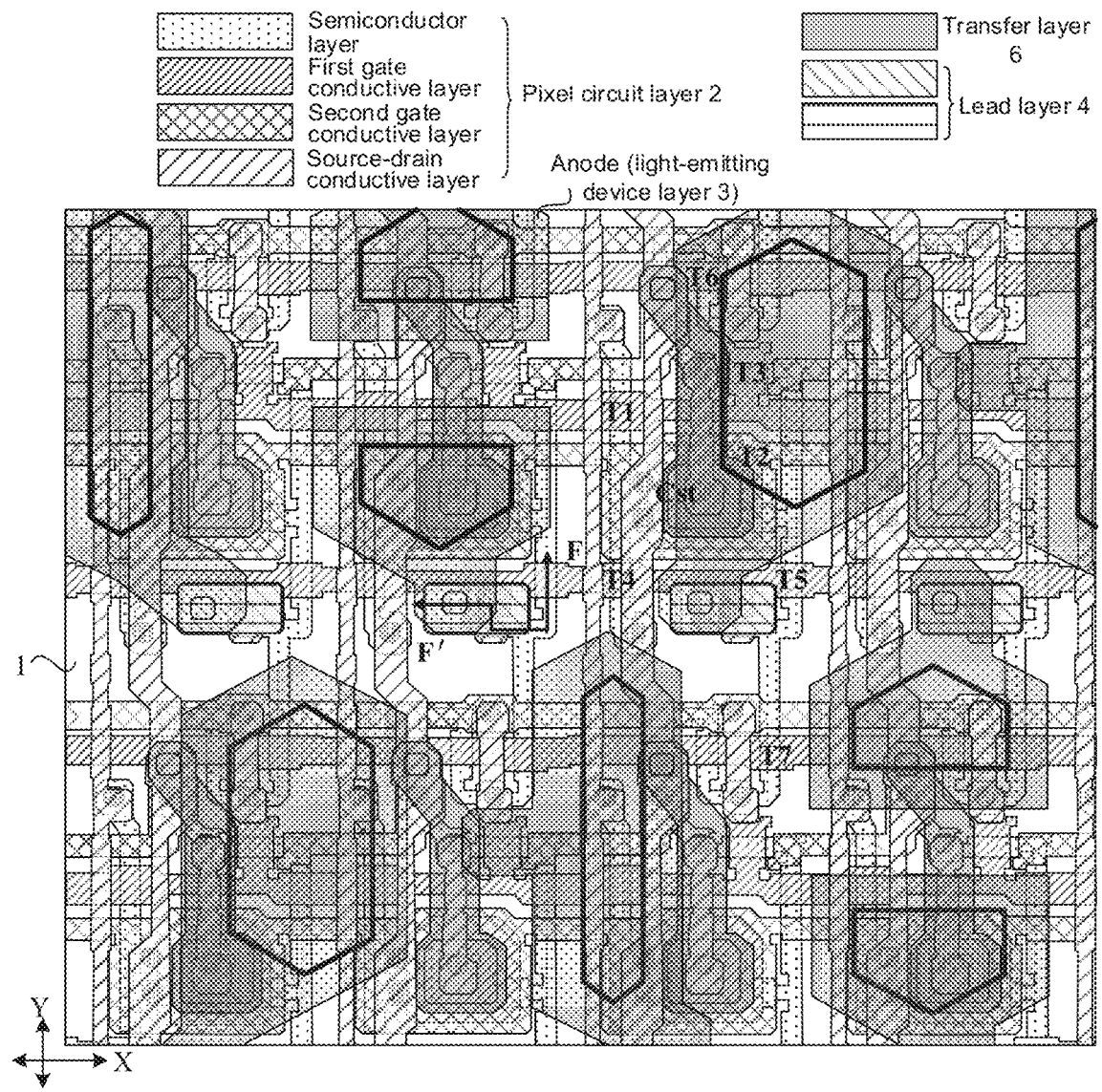
FIG. 5 is an enlarged partial view of another display substrate, in accordance with some embodiments of the present disclosure.
Figure 8:
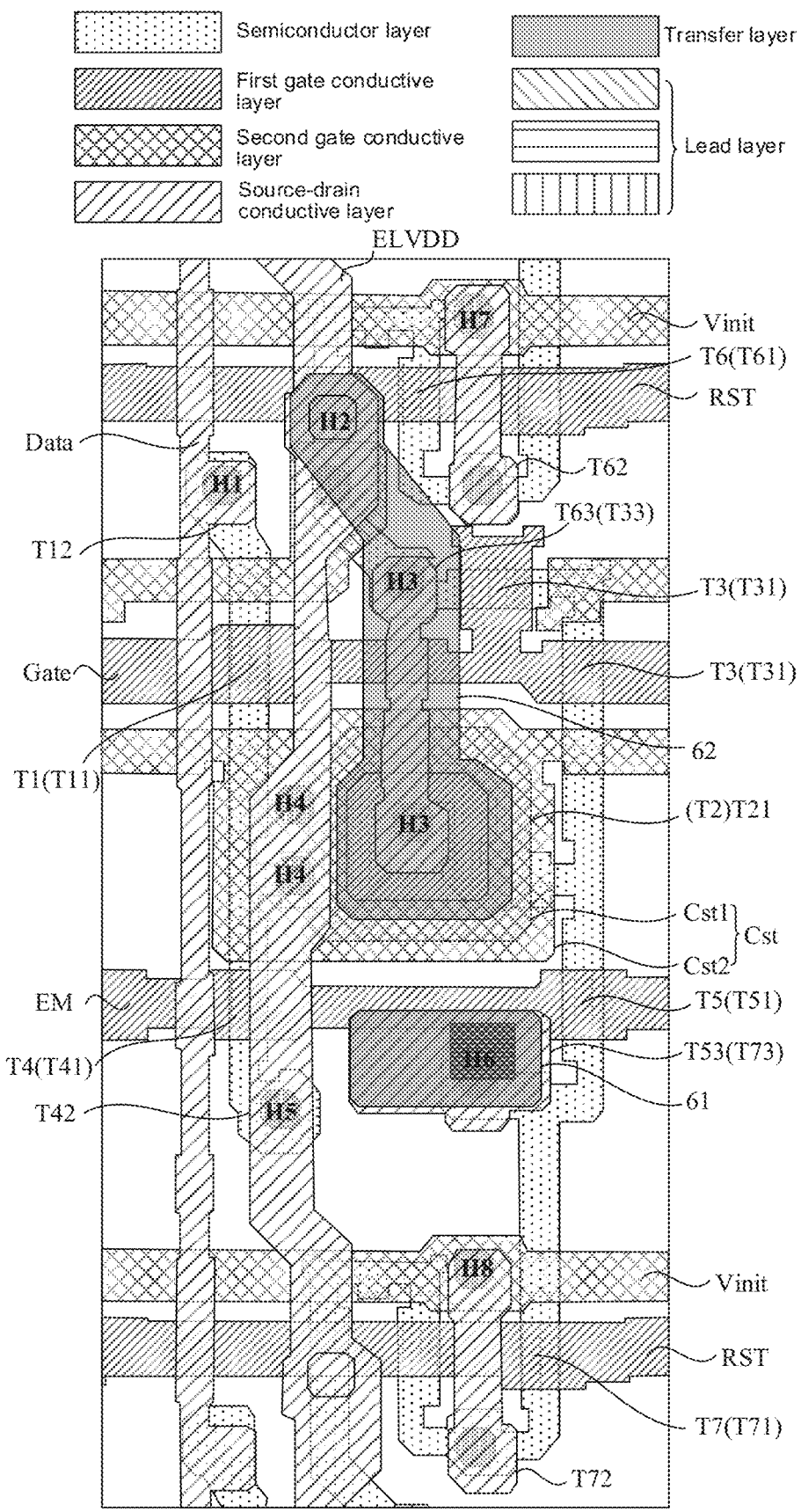
FIG. 8 is a structural diagram of a sub-pixel, in accordance with some embodiments of the present disclosure.

For example, as shown in FIGS. 3, 5, and 8, the pixel circuit layer 2 included in the display substrate 100 may include a semiconductor layer, a first gate conductive layer, a second gate conductive layer, and a source-drain conductive layer that are sequentially stacked in a direction perpendicular to and away from the substrate 1. In addition, a first gate insulating layer may be provided between the semiconductor layer and the first gate conductive layer, a second gate insulating layer may be provided between the first gate conductive layer and the second gate conductive layer, and an interlayer insulating layer may be provided between the second gate conductive layer and the source-drain conductive layer.

For example, as shown in FIGS. 3, 5, and 8, the display substrate 100 may further include a transfer layer 6 disposed on a side of the source-drain conductive layer away from the substrate 1. A material of the transfer layer and a material of the source-drain conductive layer may be the same. A planarization layer may be provided between the source-drain conductive layer and the transfer layer.

For example, as shown in FIGS. 9 to 11 and 14 to 16, the pixel circuit layer 2 may include a plurality of first pixel circuits 21 and a plurality of second pixel circuits 22.

Structures of the first pixel circuit 21 and the second pixel circuit 22 both vary and may be set according to actual needs. For example, the structure of the first pixel circuit 21 or the structure of the second pixel circuit 22 may include "2T1C", "6T1C", "7T1C", "6T2C", "7T2C", or other structures. Herein, "T" represents a transistor and a number before "T" represents the number of thin film transistors, and "C" represents a storage capacitor and a number before "C" represents the number of storage capacitors.

Figure 7:
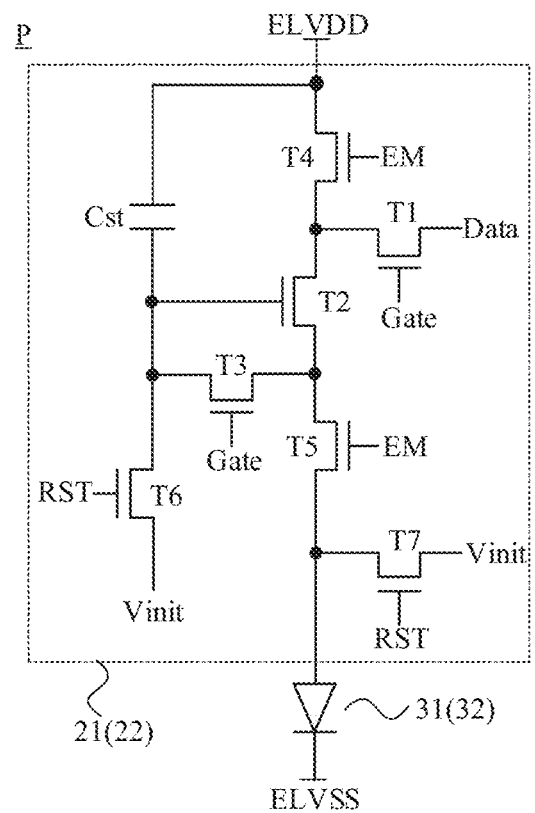
FIG. 7 is a circuit diagram of a sub-pixel, in accordance with some embodiments of the present disclosure.

For example, as shown in FIG. 7, the structure of the first pixel circuit 21 and the structure of the second pixel circuit 22 may be the same. For example, the structures of the two are both 7T1C structures. FIG. 7 is an equivalent circuit diagram of the second pixel circuit 22. FIG. 8 is a structural diagram of a single second pixel circuit 22 shown in FIG. 3 or FIG. 5. The structures of the pixel circuit layer 2 and the second pixel circuit 22 will be schematically described below with reference to FIGS. 7 and 8. Of course, an equivalent circuit diagram of the first pixel circuit 21 may be the same as the equivalent circuit diagram shown in FIG. 7, and a structural diagram of the first pixel circuit 21 may be the same as the structural diagram shown in FIG. 8.

For example, as shown in FIG. 7, the second pixel circuit 22 includes a switching transistor T1, a driving transistor T2, a compensation transistor T3, a first light-emitting control transistor T4, a second light-emitting control transistor T5, a first reset transistor T6, a second reset transistor T7, and a storage capacitor Cst.

In a case where a reset signal transmitted by a reset signal line RST is at an effective level, the first reset transistor T6 and the second reset transistor T7 may be turned on under the control of the reset signal to receive an initial signal transmitted by an initial signal line Vinit. The first reset transistor T6 may transmit the initial signal to an end of the storage capacitor Cst to reset the storage capacitor Cst, and the second reset transistor T7 may transmit the initial signal to an electrode of a light-emitting device connected to the second reset transistor T7, so as to reset the light-emitting device. Here, the driving transistor T2 may be turned on under the control of the initial signal.

In a case where a scan signal transmitted by a scan signal line Gate is at an effective level, the switching transistor T1 and the compensation transistor T3 may be turned on under the control of the scan signal. A data signal transmitted by a data signal line Data may be transmitted to a control electrode of the driving transistor T2 through the switching transistor T1, the driving transistor T2, the compensation transistor T3 in sequence, so as to charge the control electrode of the driving transistor T2 until the driving transistor T2 is turned off. In this case, a compensation for a threshold voltage of the driving transistor T2 is completed.

In a case where an enable signal transmitted by an enable signal line EM is at an effective level, the first light-emitting control transistor T4 and the second light-emitting control transistor T5 may be turned on under the control of the enable signal to receive a first voltage signal transmitted by a first voltage signal line ELVDD. The driving transistor T2 may generate a driving signal according to the data signal and the first voltage signal, and transmit the driving signal to the light-emitting device.

For example, as shown in FIG. 8, portions of the semiconductor layer covered by the first gate conductive layer respectively constitute active layers of the transistors, and portions of the semiconductor layer not covered by the first gate conductive layer are doped to form conductors. Portions of the first gate conductive layer covering the semiconductor layer respectively constitute control electrodes of the transistors, which include, for example, a control electrode T11 of the switching transistor T1, a control electrode T21 of the driving transistor T2, a control electrode T31 of the compensation transistor T3, a control electrode T41 of the first light-emitting control transistor T4, a control electrode T51 of the second light-emitting control transistor T5, a control electrode T61 of the first reset transistor T6 and a control electrode T71 of the second reset transistor T7.

For example, a first electrode plate Cst1 of the storage capacitor Cst, the scan signal line Gate for transmitting the scan signal, the reset signal lines RST for transmitting the reset signal and the enable signal line EM for transmitting the enable signal may be located in the first gate conductive layer. A second electrode plate Cst2 of the storage capacitor Cst and the initial signal lines Vinit for transmitting the initial signal may be located in the second gate conductive layer. The data signal line Data for transmitting the data signal and the first voltage signal line ELVDD for transmitting the first voltage signal may be located in the source-drain conductive layer. Further, the transfer layer may include a transfer portion 61 for transferring and a shield block 62 for shielding.

It can be understood that, the conductors in the semiconductor layer may constitute the first and second electrodes of the transistors. In order to clearly identify a first electrode or a second electrode of each transistor in the embodiments of the present disclosure, a portion of the source-drain conductive layer connected to a conductor is used as the first electrode or the second electrode of the transistor.

As shown in FIG. 8, a first electrode T12 of the switching transistor T1 and the data signal line Data may be integrated into a one-piece structure, and the first electrode T12 of the switching transistor T1 is connected to the active layer located in the semiconductor layer through a first via hole H1 extending through the interlayer insulating layer, the second gate insulating layer, and the first gate insulating layer in sequence. The control electrode T11 of the switching transistor T1 and the scan signal line Gate may be integrated into a one-piece structure.

A second electrode of the switching transistor T1 and a second electrode of the first light-emitting control transistor T4 may be located in the conductors in the semiconductor layer, and integrated into a one-piece structure. A first electrode T42 of the first light-emitting control transistor T4 and the first voltage signal line ELVDD may be integrated into a one-piece structure, and the first electrode T42 of the first light-emitting control transistor T4 is connected to the active layer located in the semiconductor layer through a fifth via hole H5 extending through the interlayer insulating layer, the second gate insulating layer, and the first gate insulating layer in sequence.

A first electrode of the driving transistor T2 may also be located in the conductors in the semiconductor layer, the first electrode of the driving transistor T2 and the second electrode of the switching transistor T1 may be integrated into a one-piece structure. A second electrode of the driving transistor T2 and a first electrode of the compensation transistor T3 may also be located in the conductors in the semiconductor layer, and integrated into a one-piece structure. The control electrode T21 of the driving transistor T2 and the first electrode plate Cst1 of the storage capacitor Cst may be integrated into a one-piece structure, and the control electrode T21 of the driving transistor T2 is connected to a second electrode T63 of the first reset transistor T6 through third via holes H3, one of which extends through the interlayer insulating layer, the second gate insulating layer, and the first gate insulating layer in sequence, and the other of which extends through the interlayer insulating layer and the second gate insulating layer in sequence.

The second electrode plate Cst2 of the storage capacitor Cst may be connected to the first voltage signal line ELVDD through fourth via hole(s) H4 extending through the interlayer insulating layer.

A second electrode T33 of the compensation transistor T3 and the second electrode T63 of the first reset transistor T6 may be integrated into a one-piece structure. The control electrode T31 of the compensation transistor T3 and the scan signal line Gate may be integrated into a one-piece structure. The compensation transistor T3 is a dual-gate transistor.

The control electrode T61 of the first reset transistor T6 and a reset signal line RST may be integrated into a one-piece structure. A first electrode T62 of the first reset transistor T6 may be connected to an initial signal line Vinit through a seventh via hole H7 extending through the interlayer insulating layer.

The control electrode T71 of the second reset transistor T7 and another reset signal line RST may be integrated into a one-piece structure. A first electrode T72 of the second reset transistor T7 may be connected to another initial signal line Vinit through an eighth via H8 extending through the interlayer insulating layer. A second electrode T73 of the second reset transistor T7 and the second electrode T53 of the second light-emitting control transistor T5 are integrated into a one-piece structure. In a same second pixel circuit 22, the control electrode of the first reset transistor T6 and the control electrode of the second reset transistor T7 are connected to different reset signal lines RST, the first electrode of the first reset transistor T6 and the first electrode of the second reset transistor T7 are connected to different initial signal lines Vinit.

A first electrode of the second light-emitting control transistor T5 may be located in the conductors in the semiconductor layer, and the first electrode of the second light-emitting control transistor T5 and the second electrode of the driving transistor T2 may be integrated into a one-piece structure. The control electrode T51 of the second light-emitting control transistor T5 is connected to the enable signal line EM, and the control electrode T51 of the second light-emitting control transistor T5 and the enable signal line EM are integrated into a one-piece structure.

Figure 9:
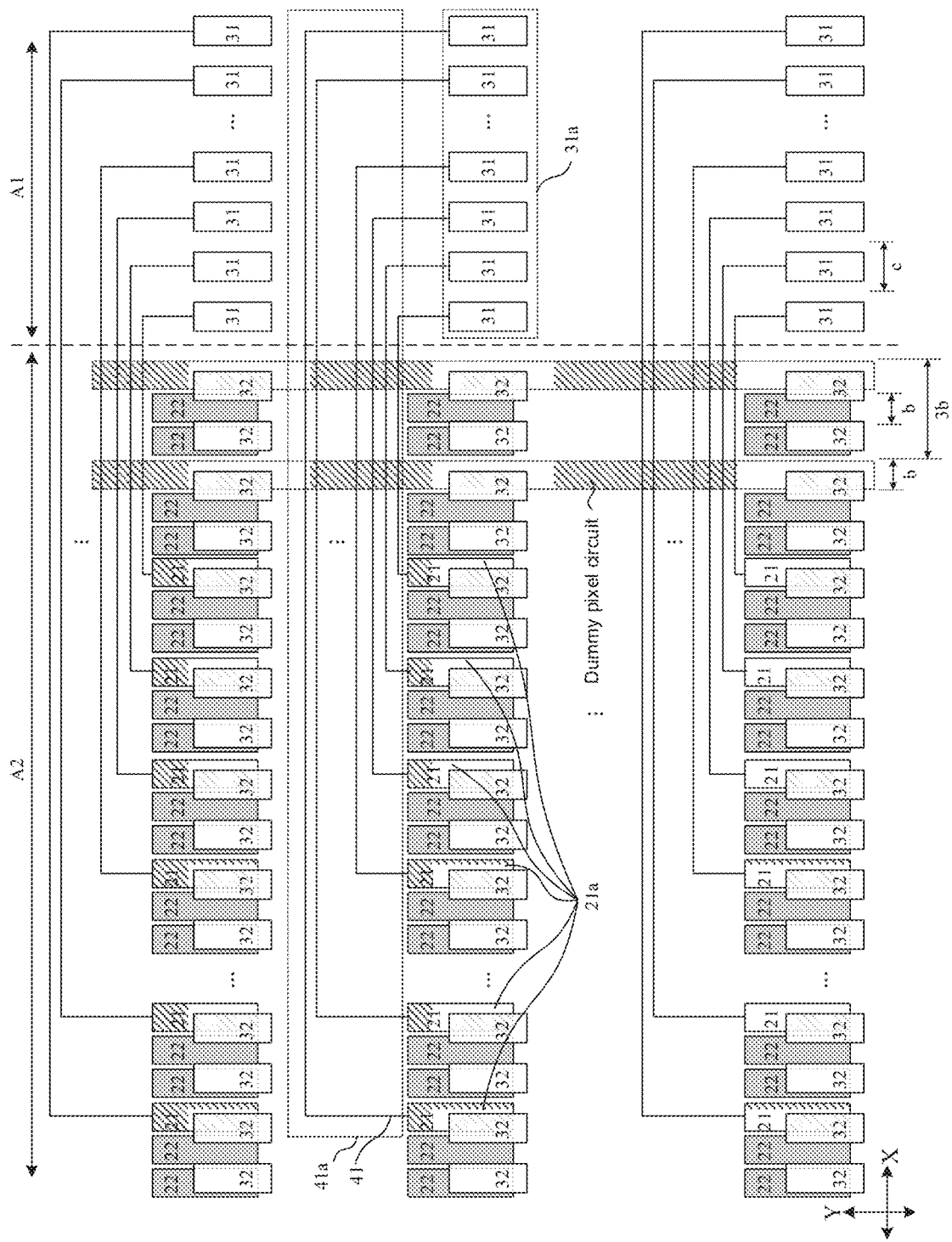
FIG. 9 is an enlarged partial view of yet another display substrate, in accordance with some embodiments of the present disclosure.
Figure 10:
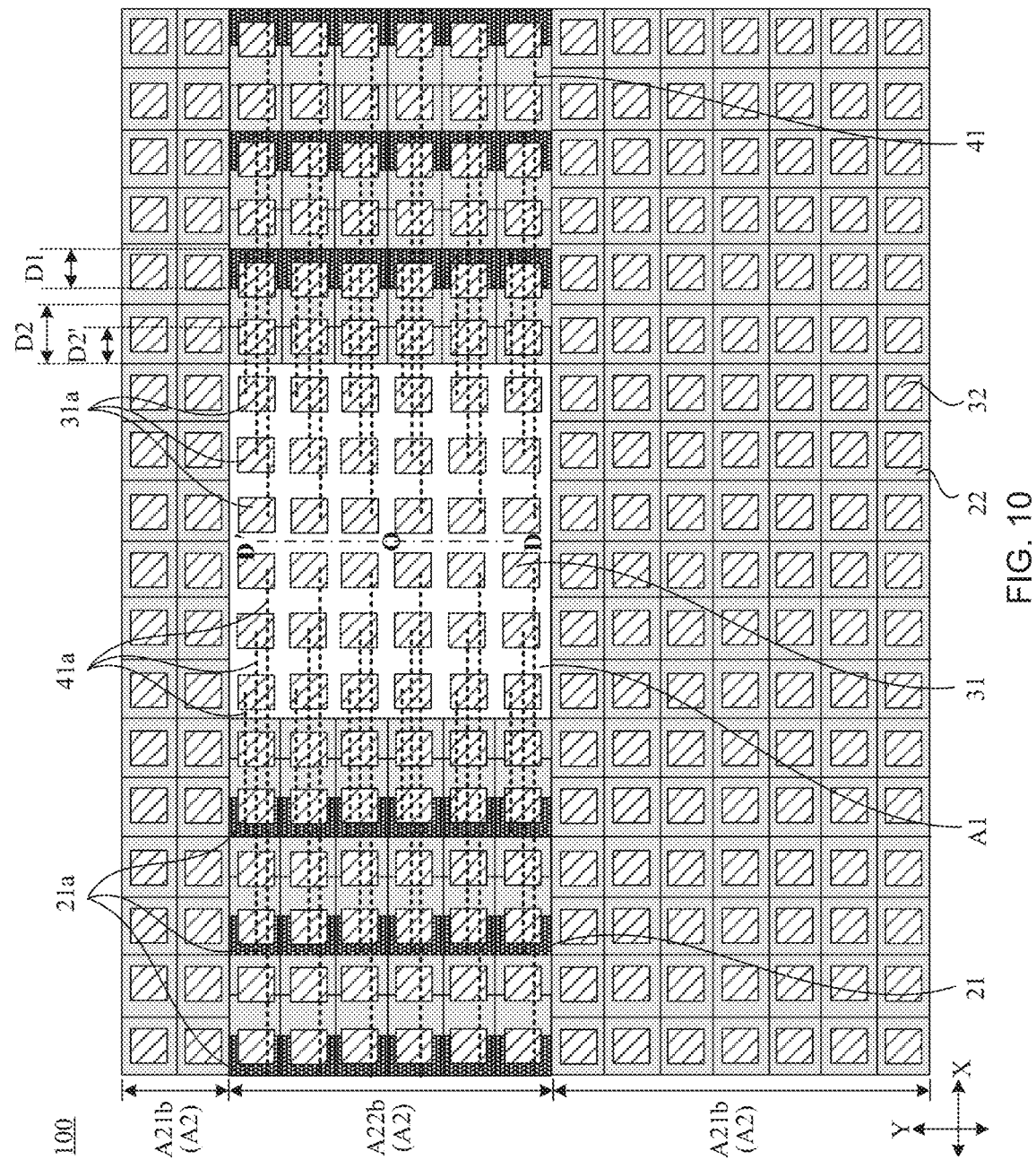
FIG. 10 is an enlarged partial view of yet another display substrate, in accordance with some embodiments of the present disclosure.
Figure 11:
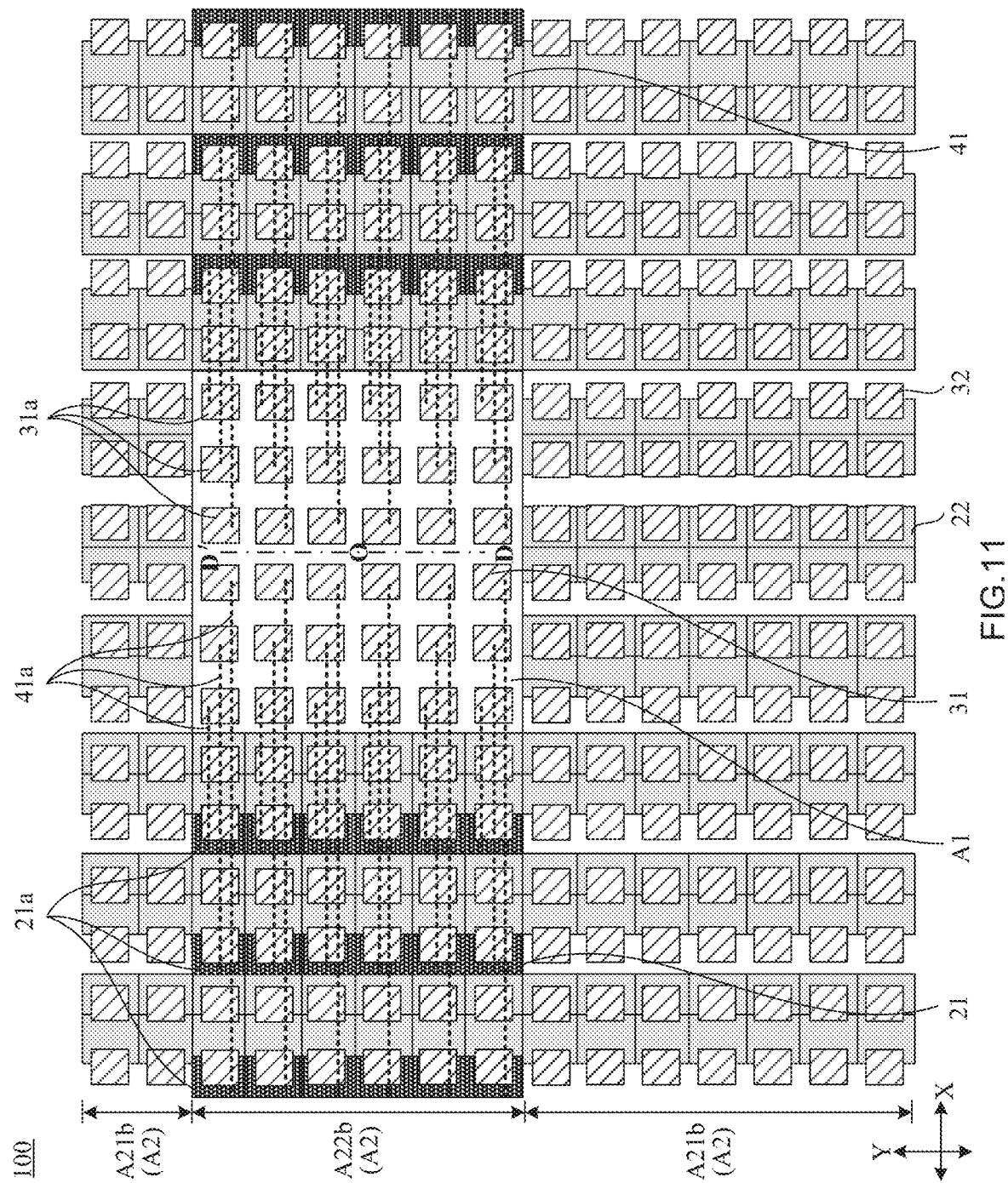
FIG. 11 is an enlarged partial view of yet another display substrate, in accordance with some embodiments of the present disclosure.

Optionally, as shown in FIGS. 9 to 11, the plurality of second pixel circuits 22 may be arranged in a plurality of columns in a first direction X, and arranged in a plurality of rows in a second direction Y. Each column of second pixel circuits may include multiple second pixel circuits 22, and the multiple second pixel circuits 22 are arranged in sequence in the second direction Y. Each row of second pixel circuits may include multiple second pixel circuits 22, and the multiple second pixel circuits 22 are arranged in sequence in the first direction X.

For example, the first direction X intersects the second direction Y.

Here, an included angle between the first direction X and the second direction Y may be set according to actual needs. For example, the included angle between the first direction X and the second direction Y is 85°, 88°, or 90°.

It will be noted that, in some examples of the present disclosure, the first pixel circuit 21 and the second pixel circuit may each include the signal lines described above. For ease of description in the embodiments of the present disclosure, the first pixel circuit 21, the second pixel circuit 22, and the signal lines are described separately.

Figure 4:
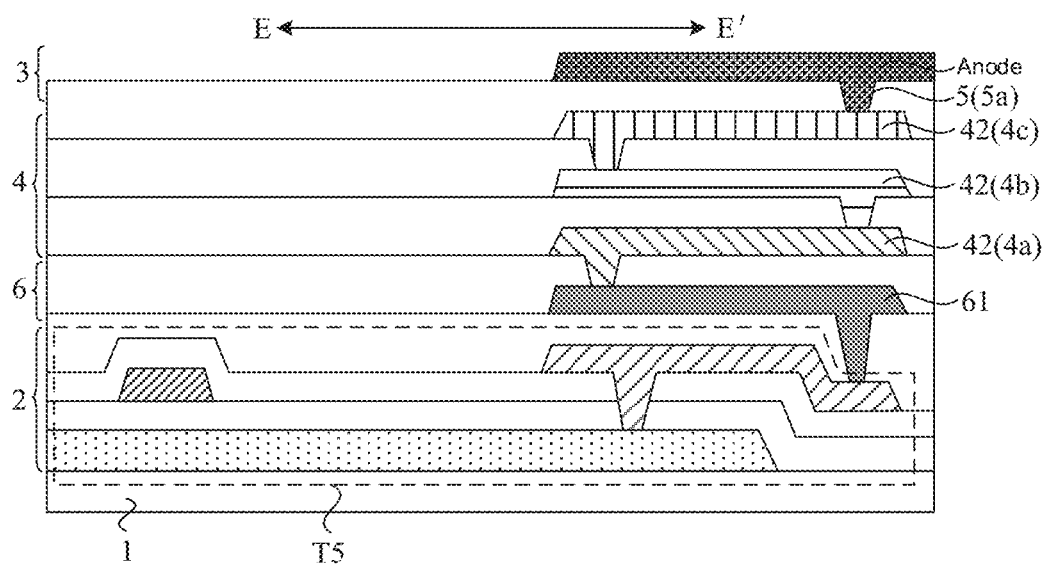
FIG. 4 is a cross-sectional view of the display substrate shown in FIG. 3 taken along the direction E-E'.
Figure 6:
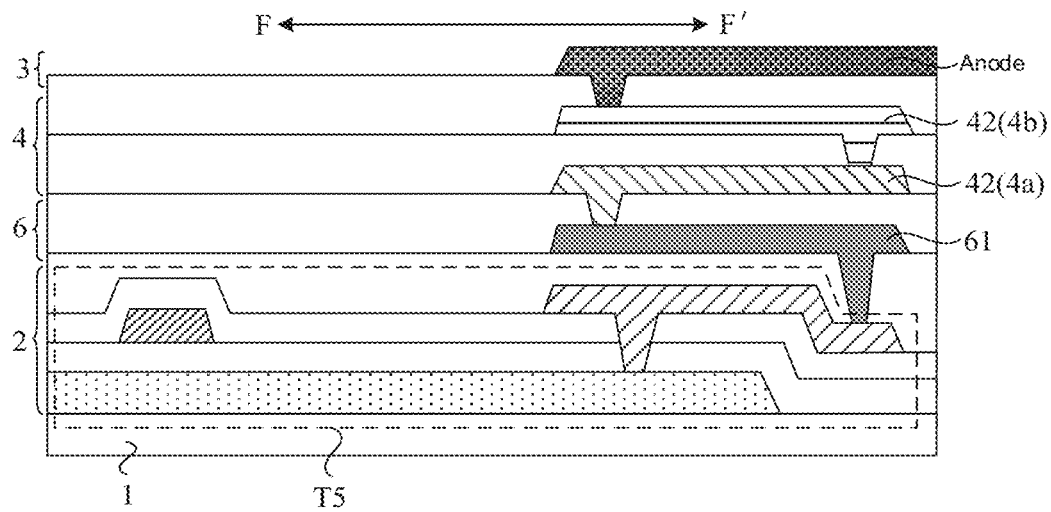
FIG. 6 is a cross-sectional view of the display substrate shown in FIG. 5 taken along the direction F-F'.

In some examples, as shown in FIGS. 2, 4, and 6, the display substrate 100 may further include a light-emitting device layer 3 disposed on a side of the pixel circuit layer 2 away from the substrate 1.

Figure 17:
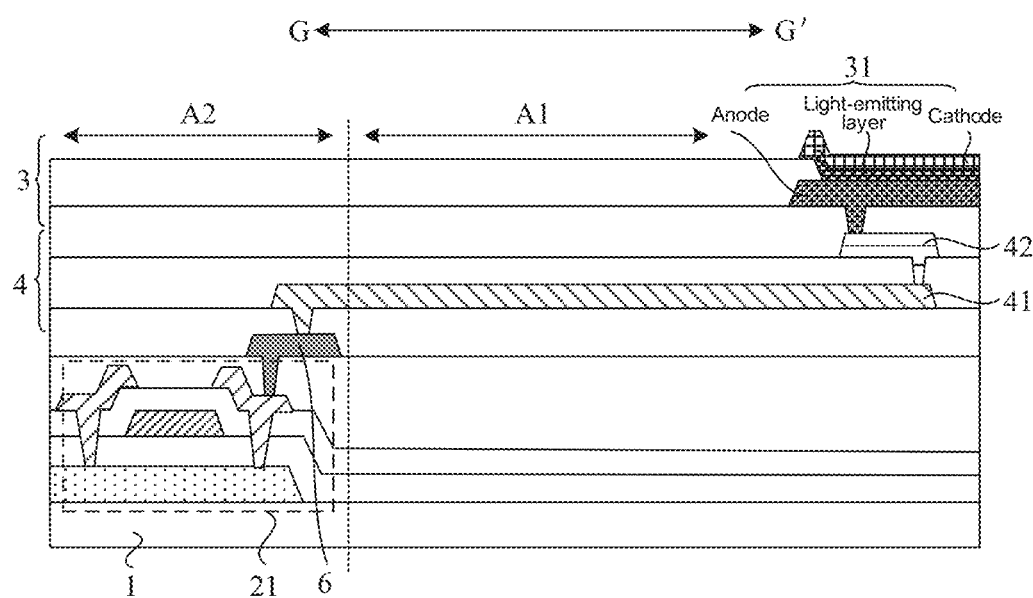
FIG. 17 is a cross-sectional view of the display substrate shown in FIG. 16 taken along the direction G-G'.

For example, the light-emitting device layer 3 may include a plurality of first light-emitting devices 31 and a plurality of second light-emitting devices 32. For example, the first light-emitting device 31 and the second light-emitting device 32 may be of a same structure. For example, as shown in FIG. 17, the first light-emitting device 31 includes an anode, a light-emitting layer, and a cathode that are stacked in sequence. Accordingly, the second light-emitting device 32 may also include an anode, a light-emitting layer, and a cathode that are stacked in sequence.

For example, at least one first pixel circuit 21 may be electrically connected to at least one first light-emitting device 31. For example, first pixel circuits 21 are electrically connected to first light-emitting devices 31 in one-to-one correspondence. Alternatively, a single first pixel circuit 21 is electrically connected to first light-emitting devices 31. Alternatively, first pixel circuits 21 are electrically connected to a single first light-emitting device 31. Each first pixel circuit 21 may provide a driving signal for corresponding first light-emitting device(s) 31, so as to drive the corresponding first light-emitting device(s) 31 to emit light. As shown in FIG. 7, the embodiments of the present disclosure will be described by considering an example in which a single first pixel circuit 21 is electrically connected to a single first light-emitting device 31.

For example, at least one second pixel circuit 22 may be electrically connected to at least one second light-emitting device 32. For example, second pixel circuits 22 are electrically connected to second light-emitting devices 32 in one-to-one correspondence. Alternatively, a single second pixel circuit 22 is electrically connected to second light-emitting devices 32. Alternatively, second pixel circuits 22 are electrically connected to a single second light-emitting device 32. Each second pixel circuit 22 may provide a driving signal for corresponding second light-emitting device(s) 32, so as to drive the corresponding second light-emitting device(s) 32 to emit light. As shown in FIG. 7, the embodiments of the present disclosure will be described by considering an example in which a single second pixel circuit 22 is electrically connected to a single second light-emitting device 32.

For example, an orthogonal projection of the at least one second light-emitting device 32 on a plane where the display substrate 100 is located at least partially overlaps with an orthogonal projection of the at least one second pixel circuit 22 on the plane where the display substrate 100 is located. That is, the orthogonal projections of the second light-emitting device 32 and the second pixel circuit 22 that are electrically connected to each other on the plane where the display substrate 100 is located may partially or entirely overlap.

Light emitted by the plurality of first light-emitting devices 31 and light emitted by the plurality of second light-emitting devices 32 cooperate each other to enable the display substrate 100 to achieve image display. A sum of the area of the first display region(s) A1 and the area of second display region A2 is approximately equal to an area of the display substrate 100, which is beneficial to improving a ratio of an area of a region in the display substrate 100 that is able to display, and improving a screen-to-body ratio of the display substrate 100, so that the display substrate 100 may achieve full-screen display.

In some examples, as shown in FIGS. 9 to 11, the plurality of first pixel circuits 21 and the plurality of second pixel circuits 22 in the pixel circuit layer 2 described above may all be located in the second display region A2. The plurality of first light-emitting devices 31 in the light-emitting device layer 3 may all be located in the first display region A1, and the plurality of second light-emitting devices 32 may all be located in the second display region A2. A transmittance of a portion of the display substrate 100 located in the first display region A1 is greater than a transmittance of a portion of the display substrate 100 located in the second display region A2.

Here, the first pixel circuit 21, the second pixel circuit 22 and the signal lines in the pixel circuit layer 2 need transmit electric signals well. Based on this, a portion of the first pixel circuit 21, a portion of the second pixel circuit 22, and the signal lines may be made of a metallic material. It can be understood that, the metallic material is capable of shielding light.

In some examples of the present disclosure, the first pixel circuit 21 for providing the driving signal for the first light-emitting device 31 is disposed in the second display region A2. Therefore, it may be possible to reduce structures, capable of shielding light, in the first display region A1. As a result, external light can pass through a gap between any two adjacent first light-emitting devices 31 from a side (e.g., a light exit side) of a portion of the display substrate 100 located in the first display region A1, and exit from another side (e.g., a non-light exit side) of the portion of the display substrate 100 located in the first display region A1, so that the portion of the display substrate 100 located in the first display region A1 has a relatively high transmittance.

In this way, in a case where the display substrate 100 is applied to the display apparatus 1000, and an optical element 200 is disposed on the non-light exit side of the display substrate 100 and under the first display region A1, the external light may pass through the portion of the display substrate 100 located in the first display region A1 to be incident on the optical element 200, and the external light is collected by the optical element 200, so that the optical element 200 can operate normally.

For example, a distribution density of the plurality of first light-emitting devices 31 is the same as a distribution density of the plurality of second light-emitting devices 32. In this way, it may not only enable the display substrate 100 to achieve full-screen display, but also be beneficial to ensuring that the display substrate 100 has a good image display quality.

For example, the distribution density of the plurality of first light-emitting devices 31 is less than the distribution density of the plurality of second light-emitting devices 32. In this way, it may increase a distance between any two adjacent first light-emitting devices 31, reduce the shielding of the first light-emitting devices 31 from the external light, and increase an area of a portion capable of transmitting light in the portion of the display substrate 100 located in the first display region A1. As a result, the amount of the external light that may pass through the portion of the display substrate 100 located in the first display region A1 may further increase. In the case where the display substrate 100 is applied to the display apparatus 1000, it may be conducive to increasing the amount of the external light collected by the optical element 200, thereby improving the operating performance of the optical element 200.

In some examples, as shown in FIGS. 9 to 11, the display substrate 100 may further include a plurality of leads 41.

For example, as shown in FIGS. 9 to 11, an end of each lead 41 is electrically connected to the first pixel circuit 21, and another end thereof is electrically connected to the first light-emitting device 31. In this way, the first pixel circuit 21 may be electrically connected to the first light-emitting device 31 through the lead 41, and thus the first pixel circuit 21 may transmit the driving signal to the corresponding first light-emitting device 31 through the lead 41.

It can be understood that, the lead 41 extending from the first pixel circuit 21 to the first light-emitting device 31 may cross first pixel circuit(s) 21 and/or second pixel circuit(s) 22, and parasitic capacitance may be generated between the lead 41 and the first pixel circuit(s) 21 and/or between the lead 41 and the second pixel circuit(s) 22.

The presence of the parasitic capacitance may easily affect the accuracy of the driving signal received by the first light-emitting device 31, and further easily affect the light-emitting accuracy of the first light-emitting device 31. As a result, the display effect of the portion of the display substrate located in the first display region may be affected.

In an implementation, in order to reduce the effect of parasitic capacitance of the lead, the routing path of the lead may be adjusted, so that the parasitic capacitance of different leads tends to be consistent. However, this may result in a large difference in the lengths of different leads and lack of regularity, and the routing paths of the leads will be specially designed according to the parasitic capacitance of different leads, which may easily increase the difficulty of designing and manufacturing the display substrate.

In light of this, in some examples, as shown in FIGS. 9 to 11, the plurality of first light-emitting devices 31 located in the first display region A1 may be divided into a plurality of first light-emitting device groups 31a. A first light-emitting device group 31a may include N first light-emitting devices 31. Accordingly, the plurality of first pixel circuits 21 located in the second display region A2 may be divided into a plurality of first pixel circuit groups 21a. A first pixel circuit group 21a may include N first pixel circuits 21. The plurality of leads 41 may be divided into a plurality of lead groups 41a. A lead group 41a may include N leads 41. N is greater than or equal to 2 (N≥2), and N is an integer.

For example, different first light-emitting device groups 31a may include the same or different number of first light-emitting devices 31; different first pixel circuit groups 21a may include the same or different number of first pixel circuits 21; and different lead groups 41a may include the same or different number of leads 41.

In the first light-emitting device group 31a, the first pixel circuit group 21a, and the lead group 41a that are electrically connected to one another, the number of the first light-emitting devices 31, the number of the first pixel circuits 21 and the number of the leads 41 are equal.

For example, in the first light-emitting device group 31a, the first pixel circuit group 21a, and the lead group 41a that are electrically connected to one another, the first light-emitting device group 31a includes twenty first light-emitting devices 31, the first pixel circuit group 21a includes twenty first pixel circuits 21a, and the lead group 41a includes twenty leads 41. Each first light-emitting device 31 is electrically connected to a respective first pixel circuit 21 through a lead 41.

For example, in a direction along the first direction X and directed from the second display region A2 to the first display region A1, N first light-emitting devices 31 in the first light-emitting device group 31a are 1st to N-th light-emitting devices.

It can be understood that, based on a positional relationship between the first display region A1 and the second display region A2, the second display region A2 may be at a periphery of two opposite sides of the first display region A1 in the first direction X. For example, as shown in FIG. 1, in the embodiments of the present disclosure, two portions of the second display region A2 located on two opposite sides of the first display region A1 in the first direction X are referred to as a first sub-region A21a and a second sub-region A22a. In this case, the description of "in the direction along the first direction X and directed from the second display region A2 to the first display region A1" refers to that in the direction along the first direction X and directed from the first sub-region A21a to the first display region A1, and/or in the direction along the first direction X and directed from the second sub-region A22a to the first display region A1.

For example, in a case where the description of "in the direction along the first direction X and directed from the second display region A2 to the first display region A1" refers to that in the direction along the first direction X and directed from the first sub-region A21a to the first display region A1, in the N first light-emitting devices 31 in the first light-emitting device group 31a, the 1st first light-emitting device is closest to the first sub-region A21a, that is, the 1st first light-emitting device is closest to an edge of the first display region A1. The 2nd, the 3rd, the 4th, ..., the (N−1)-th and the N-th first light-emitting devices may be away from the first sub-region A21a in sequence.

For another example, in a case where the description of "in the direction along the first direction X and directed from the second display region A2 to the first display region A1" refers to that in the direction along the first direction X and directed from the second sub-region A22a to the first display region A1, in the N first light-emitting devices 31 in the first light-emitting device group 31a, the 1st first light-emitting device is closest to the second sub-region A22a, that is, the 1st first light-emitting device is closest to the edge of the first display region A1. The 2nd, the 3rd, the 4th, . . . , the (N−1)-th and the N-th first light-emitting devices may be away from the second sub-region A22a in sequence.

For yet another example, in a case where the description of "in the direction along the first direction X and directed from the second display region A2 to the first display region A1" refers to that in the direction along the first direction X and directed from the first sub-region A21a to the first display region A1, and in the direction along the first direction X and directed from the second sub-region A22a to the first display region A1, in some first light-emitting device groups 31a of the plurality of first light-emitting device groups 31a, the 1st first light-emitting device is closest to the first sub-region A21a, the other light-emitting devices are away from the first sub-region A21a in sequence, and there is a certain distance between the N-th first light-emitting device and the second sub-region A22a; in some other first light-emitting device groups 31a of the plurality of first light-emitting device groups 31a, the 1st first light-emitting device is closest to the second sub-region A22a, the other light-emitting devices are away from the second sub-region A22a in sequence, and there is a certain distance between the N-th first light-emitting device and the first sub-region A21a.

For example, the N first pixel circuits 21 in the first pixel circuit group 21a are 1st to N-th first pixel circuits. The 1st to N-th first pixel circuits are disposed in a direction away from the first display region A1 in sequence.

That is, in the first pixel circuit group 21a, a first pixel circuit 21 closest to the first light-emitting device group 31a is the 1st first pixel circuit. The 2nd, the 3rd, the 4th, . . . , the (N−1) and the N-th first pixel circuits are away from the first light-emitting device group 31a in sequence.

An arrangement direction of the 1st to N-th first pixel circuits varies, and may be set according to actual needs.

For example, the 1st to N-th first pixel circuits are arranged in the first direction X. That is, the arrangement direction of the first pixel circuits 21 in the first pixel circuit group 21a is the same as the arrangement direction of the first light-emitting devices 31 in the first light-emitting device group 31a.

For another example, there is an included angle between the arrangement direction of the 1st to N-th first pixel circuits and the first direction X. A value of the included angle may be set according to actual needs. Optionally, the included angle may be 45° or 90°.

For example, as shown in FIGS. 9 to 11, N leads 41 included in the lead group 41a are arranged in parallel. For example, the N leads 41 extend in directions that are parallel or substantially parallel.

For example, the i-th first light-emitting device is electrically connected to the i-th first pixel circuit through the i-th lead, where i is equal to one of 1 to N (i=1~N). That is, the 1st first light-emitting device may be electrically connected to the 1st first pixel circuit through the 1st lead, the 2nd first light-emitting device may be electrically connected to the 2nd first pixel circuit through the 2nd lead, . . . , the (N−1)-th first light-emitting device may be electrically connected to the (N−1)-th first pixel circuit through the (N−1)-th lead, and the N-th first light-emitting device may be electrically connected to the N-th first pixel circuit through the N-th lead.

For example, lengths of the 1st to N-th leads gradually increase.

It can be understood that, the 1st to N-th first pixel circuits in the first pixel circuit group 21a are away from the first light-emitting device group 31a in sequence in an extending direction of the 1st to N-th first pixel circuits, which means that distances between the 1st, the 2nd, the 3rd, . . . , the (N−1)-th and the N-th first pixel circuits and the first light-emitting device group 31a gradually increase. Accordingly, a distance between the 1st first pixel circuit and the 1st first light-emitting device, a distance between the 2rd first pixel circuit and the 2rd first light-emitting device, . . . , a distance between the (N−1)-th first pixel circuit and the (N−1)-th first light-emitting device, and a distance between the N-th first pixel circuit and the N-th first light-emitting device gradually increase. In this way, a length of the 1st lead connecting the 1st first pixel circuit with the 1st first light-emitting device, a length of the 2rd lead connecting the 2rd first pixel circuit with the 2rd first light-emitting device, . . . , a length of the (N−1)-th lead connecting the (N−1)-th first pixel circuit with the (N−1)-th first light-emitting device, and a length of the N-th lead connecting the N-th first pixel circuit with the N-th first light-emitting device gradually increase.

For example, a portion of each lead 41 located between a corresponding first pixel circuit 21 and a corresponding first light-emitting device 31 is in a shape of a straight line. In this case, the length of the lead 41, for example, refers to a distance between the corresponding first pixel circuit 21 and the corresponding first light-emitting device 31. This not only facilitates the formation of the leads 41, but also avoids the formation of corners or tips in the leads 41, which may ensure good transmission of the driving signals in the leads 41.

By adopting the above arrangement manner and connection manner in the embodiments of the present disclosure, it may be possible to facilitate designing the routing paths of the leads 41, improve the regularity of the difference in lengths of any two adjacent leads 41 in the lead group 41a, and further reduce the number of the leads 41 required, simplify the structure of the display substrate 100, and thus reduce the difficulty of manufacturing the display substrate 100.

In addition, the first pixel circuit 21, the second pixel circuit 22 and the signal lines in the pixel circuit layer 2 are arranged regularly. In this way, for the extending leads 41, it may be possible to improve the regularity of difference in the numbers of the first pixel circuit(s) 21 and/or the second pixel circuit(s) 22 which any two adjacent leads 41 in the lead group 41a cross, and further improve the uniformity of variation in parasitic capacitance generated by any two adjacent leads 41 in the lead group 41a.

Here, the embodiments of the present disclosure may, for example, adopt an external compensation manner to perform compensation on the parasitic capacitance generated by the leads 41, so as to improve the accuracy of the driving signal received by the first light-emitting device 31 and the accuracy of the light emitted by the first light-emitting device 31, and ensure the display effect of the portion of the display substrate located in the first display region. The external compensation manner includes, but is not limited to a manner of external optical compensation (demura).

The embodiments of the present disclosure improve the uniformity of variation in parasitic capacitance generated by any two adjacent leads 41 in the lead group 41a, which may be conducive to optimization of the algorithm of the external optical compensation (demura), and may be convenient to improve the display uniformity of the display substrate 100 and improve the quality of the image displayed by the display substrate 100.

In some examples, as shown in FIGS. 9 to 11, at least one line of second pixel circuits (including at least one row of second pixel circuits or at least one column of second pixel circuits) is arranged between the 1st first light-emitting device and the 1st first pixel circuit. The N leads 41 in the lead group 41a extend from the first display region A1 to the second display region A2 passing through the at least one line of second pixel circuits (including the at least one row of second pixel circuits or the at least one column of second pixel circuits).

For example, one row, three rows, four rows or seven rows of second pixel circuits may be arranged at intervals between the 1st first light-emitting device and the 1st first pixel circuit. Alternatively, one column, three columns, four columns, eight columns, ten columns or twelve columns of second pixel circuits may be arranged at intervals between the 1st first light-emitting device and the 1st first pixel circuit.

For example, as shown in FIGS. 9 to 11, in a case where the at least one column of second pixel circuits is arranged between the 1st first light-emitting device and the 1st first pixel circuit, the 1st lead in the lead group 41a may cross the at least one column of second pixel circuits from the first display region A1 to the second display region A2, and the 2nd, the 3rd, . . . , the N-th leads may cross the at least one column of second pixel circuits from the first display region A1, and continue to cross at least one column of second pixel circuits to the second display region A2.

In an implementation, the 1st first light-emitting device is disposed adjacent to the 1st first pixel circuit, and there is no second pixel circuit between the 1st first light-emitting device and the 1st first pixel circuit. In this case, a length of the 1st lead with the minimum length in the lead group is, for example, L. For example, a difference between lengths of any two adjacent leads in the lead group is m. In this case, a length of the N-th lead with the maximum length is (L+m (N−1)). A ratio of the length of the N-th lead to the length of the 1st lead is:

$$\frac{L + m(N-1)}{L} = 1 + \frac{m(N-1)}{L}.$$

In some examples of the present disclosure, in a case where the at least one row of second pixel circuits or at least one column of second pixel circuits is arranged between the 1st first light-emitting device and the 1st first pixel circuit, the length of the 1st lead connecting the 1st first light-emitting device with the 1st first pixel circuit is, for example, (L+p). For example, the difference between the lengths of any two adjacent leads in the lead group is m. In this case, the length of the N-th lead with the maximum length is (L+p+m (N−1)). The ratio of the length of the N-th lead to the length of the 1st lead is:

$$\frac{L + p + m(N-1)}{L + p} = 1 + \frac{m(N-1)}{L + p}.$$

Where $$\frac{m(N-1)}{L+p}$$

is less than $$\frac{m(N-1)}{L}.$$

Accordingly, a ratio of the parasitic capacitance generated by the N-th lead to the parasitic capacitance generated by the 1st lead is less than the ratio in the above implementation.

That is, in the embodiments of the present disclosure, in the case where the at least one row of second pixel circuits or at least one column of second pixel circuits is arranged between the 1st first light-emitting device and the 1st first pixel circuit, the length of the 1st lead may increase by a relatively large multiples, while the length of the N-th lead may increase by a relatively small multiples. In this way, it may be possible to effectively reduce the ratio of the length of the N-th lead to the length of the 1st lead, and effectively reduce the ratio of the parasitic capacitance generated by the N-th lead to the parasitic capacitance generated by the 1st lead.

It can be understood that, the smaller the ratio of the length of the N-th lead with the maximum length to the length of the 1st lead with the minimum length, the smaller different between the parasitic capacitance generated by the N-th lead and the parasitic capacitance generated by the 1st lead, and the smaller difference between the loss of the driving signal on the N-th lead and the loss of the driving signal on the 1st lead. In this way, it may be possible to reduce the difference of display grayscales and improve the display effect during the image display of the display substrate 100. Moreover, in the subsequent process where compensation is performed on the grayscale difference through the algorithm of external optical compensation (demura), the smaller difference of the display grayscales, the less workload of the algorithm of external optical compensation (demura), which is beneficial to further optimizing the algorithm of external optical compensation (demura). In addition, after the difference of the display grayscales is reduced to a certain degree, it may be ensured that the display substrate 100 has the good image quality without using the algorithm of external optical compensation (demura) to perform compensation.

Therefore, in the display substrate 100 provided by some embodiments of the present disclosure, the first display region A1 and the second display region A2 are provided, the first light-emitting devices 31 are disposed in the first display region A1, and the first pixel circuits 21 for providing the driving signals for the light-emitting devices 31 are disposed in the second display region A2. As a result, it may be possible to avoid a situation that the first pixel circuits 21 shield the light incident on the first display region A1, and thus improve the transmittance of the portion of the display substrate 100 located in the first display region A1. In the case where the display substrate 100 is applied to the display apparatus 1000, the external light may pass through the portion of the display substrate 100 located in the first display region A1 to be incident on the optical element 200 of the display apparatus 1000. In this way, it may be possible to enable the optical element 200 to operate normally, and to improve the ratio of the area of the displayable region in the display substrate 100, so that the display substrate 100 and the display apparatus 1000 may achieve full-screen display.

Moreover, in the embodiments of the present disclosure, the leads 41 each connecting the first light-emitting device 31 with the first pixel circuit 21 are provided, and the N leads 41 in the lead group are arranged in parallel, so that the lengths of the 1st to N-th leads gradually increase. In addition, the at least one row of second pixel circuits or the at least one column of second pixel circuits is arranged between the 1st first light-emitting device in the first light-emitting device group 31a and the 1st first pixel circuit in the first pixel circuit group 21a. As a result, it may be possible to facilitate designing the routing paths of the leads 41, so as to improve the regularity of the difference in lengths of any two adjacent leads 41 in the lead group 41a, and improve the uniformity of variation in parasitic capacitance generated by any two adjacent leads 41 in the lead group 41a. Moreover, it may also greatly increase the length of the 1st lead by providing the at least one row of second pixel circuits or the at least one column of second pixel circuits between the 1st first light-emitting device and the 1st first pixel circuit, and further reduce the ratio of the length of the N-th lead to the length of the 1st lead, reduce the ratio of the parasitic capacitance generated by the N-th lead to the parasitic capacitance generated by the 1st lead, and reduce the difference of the display grayscales of the display substrate 100, so as to optimize the algorithm of external optical compensation (demura), and even save the algorithm of external optical compensation (demura).

In some embodiments, in the N leads 41 included in the lead group 41a, the ratio of the length of the N-th lead to the length of the 1st lead is $\alpha$, and $\alpha$ is less than or equal to 25 ($\alpha \leq 25$).

In some examples, $\alpha$ is equal to 25 ($\alpha=25$), $\alpha$ is less than or equal to 24 ($\alpha \leq 24$), $\alpha$ is less than or equal to 22 ($\alpha \leq 22$), $\alpha$ is less than or equal to 20 ($\alpha \leq 20$), or $\alpha$ is less than or equal to 18 ($\alpha \leq 18$), or the like.

By setting the ratio of the length of the N-th lead to the length of the 1st lead to be less than or equal to 25, it may be possible to effectively reduce the ratio of the length of the N-th lead with the maximum length to the length of the 1st lead with the minimum length, reduce the difference between the parasitic capacitance generated by the N-th lead and the parasitic capacitance generated by the 1st lead, and thus reduce the grayscale difference of the image displayed by display substrate 100. Moreover, in the subsequent process where compensation is performed on the grayscale difference through the algorithm of external optical compensation (demura), it may also be possible to reduce the workload of the algorithm of external optical compensation (demura), and optimize the algorithm of external optical compensation (demura).

For example, the ratio $\alpha$ of the lengths satisfies that a is less than or equal to 15 ($\alpha \leq 15$).

By setting the ratio of the length of the N-th lead to the length of the 1st lead to be less than or equal to 15, it may be possible to further reduce the ratio of the length of the N-th lead with the maximum length to the length of the 1st lead with the minimum length, further reduce the difference between the parasitic capacitance generated by the N-th lead and the parasitic capacitance generated by the 1st lead, and thus further reduce the grayscale difference of the image displayed by display substrate 100. Moreover, in the subsequent process where compensation is performed on the grayscale difference through the algorithm of external optical compensation (demura), it may also be possible to further reduce the workload of the algorithm of external optical compensation (demura), and further optimize the algorithm of external optical compensation (demura).

For example, the ratio $\alpha$ of the lengths may take a value in a range of 5 to 10, 10 to 15, 15 to 20, or 7 to 13.

For example, the ratio $\alpha$ of the lengths may take a value of 5, 6, 7.5, 9.1, 10, 12, 14, 15, or the like.

In some embodiments, the number of rows or columns of second pixel circuits that are arranged at intervals between the 1st first light-emitting device and the 1st first pixel circuit is $\beta$, and $\beta$ is less than or equal to 30 ($\beta \leq 30$).

In some examples, as shown in FIGS. 9 to 11, the N first pixel circuits in the first pixel circuit group 21a are arranged in sequence in the first direction X. In this case, at least one column of second pixel circuits is arranged at intervals between the 1st first light-emitting device and 1st first pixel circuit. The number of the columns of second pixel circuits 22 that are arranged at intervals is $\beta$, and $\beta$ is less than or equal to 30 ($\beta \leq 30$).

For example, $\beta$ satisfies that $\beta$ is equal 30 ($\beta=30$), $\beta$ is less than or equal to 28 ($\beta \leq 28$), $\beta$ is less than or equal to 25 ($\beta \leq 25$), $\beta$ is less than or equal to 21 ($\beta \leq 21$), $\beta$ is less than or equal to 20 ($\beta \leq 20$), or $\beta$ is less than or equal to 15 ($\beta \leq 15$).

By adopting the arrangement manner described above, it may be possible to ensure that the length of the N-th lead increases by a relatively small multiples, and thus ensure that the ratio of the length of the N-th lead to the length of the 1st lead is relatively small, so as to ensure a good improvement effect on the grayscale difference of the image displayed by the display substrate 100 and a good optimization effect on the algorithm of external optical compensation (demura).

In some embodiments, a ratio of the number of rows or columns of pixel circuits that are arranged at intervals between the N-th first light-emitting device and the N-th first pixel circuit to the number of rows or columns of second pixel circuits that are arranged at intervals between the 1st first light-emitting device and the 1st first pixel circuit is $\gamma$, and $\gamma$ is greater than or equal to 5 and is less than or equal to 50 ($5 \leq \gamma \leq 50$).

It can be understood that, first pixel circuits 21 and second pixel circuits 22 are arranged at intervals between the i-th first light-emitting device and the i-th first pixel circuit except for between the 1st first light-emitting device and the 1st first pixel circuit. That is, the pixel circuits that are arranged at intervals between the N-th first light-emitting device and the N-th first pixel circuit include the first pixel circuits and the second pixel circuits.

In addition, since a shape of the first display region A1 is variable, different first light-emitting device groups 31a may include different number of first light-emitting devices 31. For example, as shown in FIG. 1, in the second direction Y, the closer the first light-emitting device group 31a is to an upper portion or a lower portion of the edge of the first display region A1, the less the number of the first light-emitting devices 31 included in the first light-emitting device group 31a is; and the closer the first light-emitting device group 31a is to a middle portion of the edge of the first display region A1, the more the number of first light-emitting devices 31 included in the first light-emitting device group 31a is.

In the first light-emitting device group 31a with a relatively small number of first light-emitting devices, the ratio $\gamma$ of the number of rows or columns of the pixel circuits that are arranged at intervals between the N-th first light-emitting device and the N-th first pixel circuit to the number of rows or columns of second pixel circuits that are arranged at intervals between the 1st first light-emitting device and the 1st first pixel circuit may be relatively small. In the first light-emitting device group 31a with a relatively large number of first light-emitting devices, the ratio γ of the number of rows or columns of the pixel circuits that are arranged at intervals between the N-th first light-emitting device and the N-th first pixel circuit to the number of rows or columns of second pixel circuits that are arranged at intervals between the 1st first light-emitting device and the 1st first pixel circuit may be relatively large.

By adopting the arrangement manner described above, the length of the N-th lead may not be too large, and it may also be possible to ensure that the ratio of the length of the N-th lead to the length of the 1st lead is relatively small, so as to ensure the good improvement effect on the grayscale difference of the image displayed by the display substrate 100 and the good optimization effect on the algorithm of external optical compensation (demura).

In some embodiments, a sequence constituted by values of lengths of the N leads 41 in the lead group 41a is an arithmetic sequence. That is, the difference between length values of any two adjacent leads 41 is the same. Alternatively, a sequence constituted by the values of the lengths of the N leads 41 in the lead group 41a in the first direction X is an arithmetic sequence. That is, the difference between length values of any two adjacent leads 41 in the first direction X is the same.

It can be understood that, in a case where there is an included angle between the extending direction of the lead 41 and the first direction X, a length value of the lead 41 in the first direction X is a component of an actual length value of the lead 41 in the first direction X.

For example, the length value of the 1st lead is L, and the difference between length values of any two adjacent leads 41 in the lead group 41a is m. In this case, a sequence constituted by the values of the lengths of the N leads 41 is L, (L+m), (L+2m), (L+3m), . . . , (L+m(N−2)), (L+m(N−1)). Regarding the length values of the leads 41 in the first direction X, reference may be made to the description here and details will not be repeated again.

By setting the sequence constituted by the values of the lengths of the N leads 41 or the sequence constituted by the values of the lengths of the N leads 41 in the first direction X to be an arithmetic sequence, it may be possible to ensure that the length values of the N leads 41 are uniformly variable, which is conducive to the optimization of the algorithm of external optical compensation (demura), and is beneficial to improving the display quality of the display substrate 100. Moreover, this arrangement manner is also beneficial to improving the uniformity of variation in parasitic capacitance generated by the N leads 41, thereby facilitating further optimization of the algorithm of external optical compensation (demura), and further improving the display quality of the display substrate 100.

In some embodiments, a sequence constituted by values of resistances of the N leads 41 in the lead group 41a is an arithmetic sequence. That is, the difference between the values of the resistances of any two adjacent leads 41 is the same.

For example, the resistance value of the 1st lead is R, and the difference between resistance values of any two adjacent leads 41 in the lead group 41a is t. In this case, a sequence constituted by the values of the resistances of the N leads 41 is R, (R+t), (R+2t), (R+3t), . . . , (R+t(N−2)) and (R+t(N−1)).

It can be understood that, after the driving signal provided by the first pixel circuit 21 is transmitted to the lead 41, the presence of the resistance of the lead 41 may result in a certain loss of the driving signal, which may reduce the accuracy of the driving signal received by the first light-emitting device 31.

By setting the sequence constituted by the values of the resistances of the N leads 41 to be an arithmetic sequence, it may be possible to ensure that the resistance values of the N leads 41 are uniformly variable, which is beneficial to reducing the difficulty of compensating the resistance of leads 41 and improving the display quality of the display substrate 100.

In some embodiments, a parasitic capacitance is generated between each lead 41 and the second pixel circuit(s) 22 through which the lead 41 passes, or between each lead 41 and the first pixel circuit(s) 21 through which the lead 41 passes, or between each lead 41 and both the second pixel circuit(s) 22 and the first pixel circuit(s) 21 through which the lead 41 passes. A sequence constituted by the values of parasitic capacitances generated by the N leads 41 is an arithmetic sequence. That is, the difference between values of parasitic capacitances generated by any two adjacent leads 41 is the same.

For example, the value of the parasitic capacitance generated by the 1st lead is Cs, and the difference between values of the parasitic capacitances of any two adjacent leads 41 in the lead group 41a is u. In this case, a sequence constituted by the values of the parasitic capacitances generated by the N leads 41 is Cs, (Cs+u), (Cs+2u), (Cs+3u), . . . , (Cs+u(N−2)), (Cs+u(N−1)).

It can be understood that, after the driving signal provided by the first pixel circuit 21 is transmitted to the lead 41, the presence of the parasitic capacitance in the lead 41 may result in a large loss of the driving signal, which may greatly reduce the accuracy of the driving signal received by the first light-emitting device 31, and time when the first light-emitting device 31 receives the driving signal is delayed.

By setting the sequence constituted by the values of the parasitic capacitances generated by the N leads 41 to be an arithmetic sequence, it may be possible to ensure that the values of the parasitic capacitances generated by the N leads 41 are uniformly variable, which is conducive to the compensation of the value of parasitic capacitance and the delayed time, the optimization of the algorithm of external optical compensation (demura), and the improvement of the display quality of the display substrate 100.

It can be understood that, the arrangement direction of the 1st to N-th first pixel circuits in the first pixel circuit group 21a may be set in a varied way.

In some examples, as shown in FIGS. 9 to 11, the arrangement direction is the first direction X.

For example, the first light-emitting device group 31a and the first pixel circuit group 21a electrically connected to the first light-emitting device group 31a are arranged in a same row. That is, in the first direction X, the first light-emitting device group 31a and the first pixel circuit group 21a are located in the same row. Accordingly, the N leads 41 in the lead group 41a may extend in the first direction X.

In this case, at least one column of second pixel circuits is arranged between the 1st first light-emitting device and the 1st first pixel circuit. Accordingly, the N leads 41 may pass through the at least one column of second pixel circuits in the first direction X from the first display region A1 to the second display region A2.

By setting the arrangement direction to be the first direction X, and making the first light-emitting device group 31a and the first pixel circuit group 21a electrically connected to the first light-emitting device group 31a arranged in the same row, it may be possible to facilitate wiring of the signal lines (e.g., gate lines) in the pixel circuit layer 2, and facilitate driving the first pixel circuit group 21a and reducing the difficulty of designing and manufacturing the display substrate 100.

It can be understood that, the first pixel circuit group 21a may be arranged in a same row as a single row of second pixel circuits, which is beneficial to driving the first pixel circuit group 21a and the single row of second pixel circuits simultaneously. At least one second pixel circuit 22 may be disposed between any two adjacent first pixel circuits 21, which may reduce misalignment between the second pixel circuit 22 and a corresponding second light-emitting device 32. For example, the same number of second pixel circuits 22 are arranged at intervals between any two adjacent first pixel circuits 21, which may be beneficial to improving the uniformity of variation in length of the N leads 41 in the lead group 41a and the uniformity of variation in parasitic capacitance generated by the N leads 41.

For example, as shown in FIG. 9, the first pixel circuit group 21a may include twenty first pixel circuits 21, the first light-emitting device group 31a may include twenty first light-emitting devices 31, and the lead group 41a may include twenty leads 41. Four columns of second pixel circuits are arranged at intervals between the 1st first light-emitting device and the 1st first pixel circuit. Two second pixel circuits 22 are arranged at intervals between any two adjacent first pixel circuits 21, that is, one first pixel circuit 21 is arranged between every two adjacent groups each consisting of two second pixel circuits 22.

For example, as shown in FIG. 9, a dimension of a region occupied by each second pixel circuit 22 or each first pixel circuit 21 in the first direction X is b, and a dimension of a region occupied by each first light-emitting device 31 is c, and 3b is equal to 2c (3b=2c).

In a case where there is no second pixel circuit arranged at intervals between the 1st first light-emitting device and the 1st first pixel circuit, the length of the 1st lead is a sum of a dimension of a region occupied by the 1st first pixel circuit and a dimension of a region occupied by the 1st first light-emitting device, i.e., a sum of b and c, the sum being equal to 2.5b (b+c=2.5b). A difference between the lengths of any two adjacent leads is a sum of a dimension of a region occupied by two second pixel circuits, a dimension of a region occupied by one first pixel circuit and a dimension of a region occupied by one first light-emitting device, i.e., a sum of 2b, b and c, the sum being equal to a sum of 3b and c (2b+b+c=3b+c). A length of the N-th (e.g., 20th) lead is (b+c)+19 (3b+c)=88b. A ratio of the length of the 20th lead to the length of the 1st lead is 35.20.

In a case where six columns of second pixel circuits are arranged at intervals between the 1st first light-emitting device and the 1st first pixel circuit, the length of the 1st lead is a sum of the dimension of the region occupied by the 1st first pixel circuit, the dimension of the region occupied by the 1st first light-emitting device, and a dimension of a region occupied by the six second pixel circuits arranged at intervals between the 1st first light-emitting device and the 1st first pixel circuit (i.e., b+c+6b=7b+c). Since 3b is equal to 2c (3b=2c), a sum of 7b and c is equal to 8.5b (7b+c=8.5b). The difference between the lengths of any two adjacent leads is a sum of the dimension of the region occupied by two second pixel circuits, the dimension of the region occupied by one first pixel circuit and the dimension of the region occupied by one first light-emitting device (i.e., 2b+b+c=3b+c). The length of the N-th (e.g., 20th) lead is (7b+c)+19 (3b+c)=94b. The ratio of the length of the 20th lead to the length of the 1st lead is 11.06 (two digits after the decimal point is retained).

As can be seen from the above, in a case where six columns of second pixel circuits are arranged at intervals between the 1st first pixel circuit and the 1st first pixel circuit, compared with the case where there is no second pixel circuit arranged at intervals therebetween, the length of the 1st lead increases by 6b, which increases by a relatively large multiples, while the length of the N-th lead also increases by 6b, which increases by a relatively small multiples. Accordingly, the ratio of the length of the 20th lead to the length of the 1st lead is greatly reduced, which is conducive to optimization of the algorithm of external optical compensation (demura).

Optionally, in the embodiments of the present disclosure, one first pixel circuit 21 may be arranged between every two adjacent groups each consisting of four second pixel circuits 22, or one first pixel circuit 21 may be arranged between every two adjacent groups each consisting of six second pixel circuits 22, or one first pixel circuit 21 may be arranged between every two adjacent groups each consisting of seven second pixel circuits 22, as long as it may be possible to reduce the ratio of the length of the N-th lead to the length of the 1st lead, and optimize the algorithm of external optical compensation (demura).

In some other examples, the included angle between the arrangement direction and the first direction X is 45°. In this case, the N leads 41 in the lead group 41a, for example, may extend in a direction perpendicular to the first direction X, and extend from the first display region A1 to the second display region A2 passing through at least one row of second pixel circuits or at least one column of second pixel circuits in the direction perpendicular to the first direction X.

In yet other examples, the included angle between the arrangement direction and the first direction X is 90°. In this case, an included angle between the extending direction of the N leads 41 in the lead group 41a and the first direction X is, for example, 45°. The N leads 41 may extend from the first display region A1 to the second display region A2 passing through at least one row of second pixel circuits or at least one column of second pixel circuits in a direction having an included angle of 45° with the first direction X.

It can be understood that, the number of rows of second pixel circuits or columns of second pixel circuits that are arranged at intervals between the 1st first light-emitting device and the 1st first pixel circuit may be set according to actual needs, as long as the ratio of the length of the N-th lead 41 to the length of the 1st lead 41 is less than or equal to a preset value.

Optionally, the number of the rows of second pixel circuits or the columns of second pixel circuits that are arranged at intervals between the 1st first light-emitting device and the 1st first pixel circuit is related to an arrangement manner of sub-pixels P in the display substrate 100. That is, the arrangement manner of the sub-pixels P varies, and thus the number of the rows of second pixel circuits or the columns of second pixel circuits that are arranged at intervals between the 1st first light-emitting device and the 1st first pixel circuit may be different. This is beneficial to ensuring normal use of the algorithm of external optical compensation (demura), and avoiding confusion of the algorithm.

For example, the sub-pixel P may include the second pixel circuit 22 and the second light-emitting device 32 that are electrically connected to each other. Of course, the sub-pixel P may include the first pixel circuit 21 and the first light-emitting device 31 that are electrically connected to each other.

The number of the columns of second pixel circuits arranged at intervals between the 1st first light-emitting device and the 1st first pixel circuit will be described schematically below according to different arrangement manners of the sub-pixels P by considering an example in which the arrangement direction is the first direction X, and the first light-emitting device group 31*a* and the first pixel circuit group 21*a* electrically connected thereto are arranged in a same row.

Figure 12:
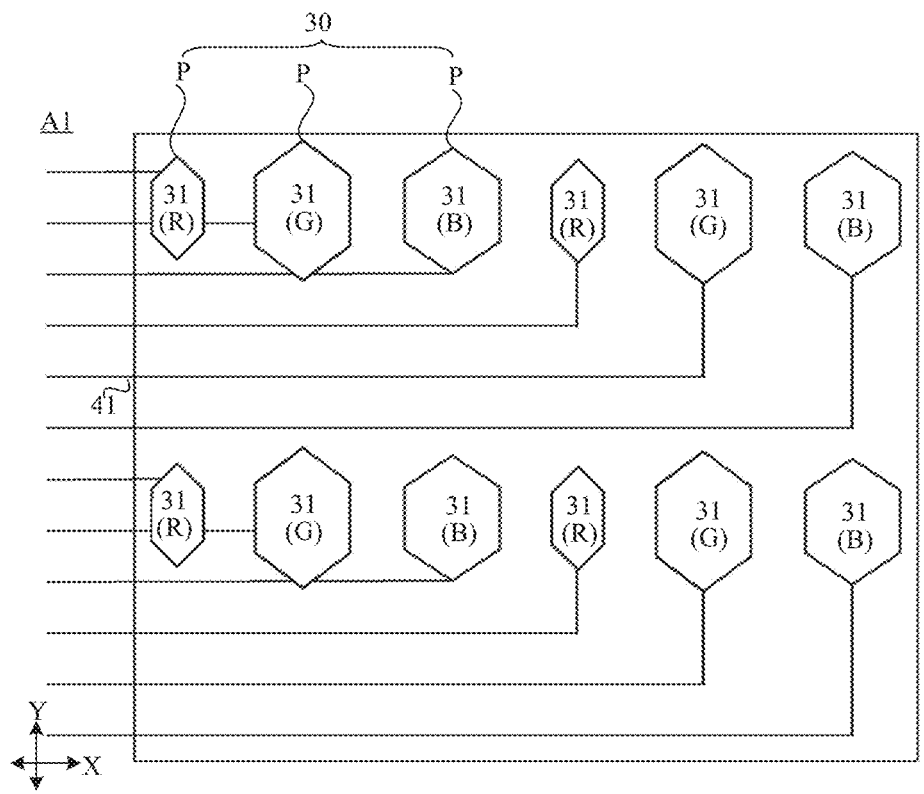
FIG. 12 is an enlarged partial view of yet another display substrate, in accordance with some embodiments of the present disclosure.

In some examples, as shown in FIG. 12, the display substrate 100 includes a plurality of pixel units 30, each pixel unit includes three sub-pixels P arranged in the first direction X.

For example, the three sub-pixels P described above include a red (R) sub-pixel, a green (G) sub-pixel, and a blue (B) sub-pixel. The RGB sub-pixels are arranged periodically in the first direction X.

For example, X second pixel circuits 22 belonging to at least one pixel unit are arranged at intervals between the 1st first light-emitting device and the 1st first pixel circuit, and X is a multiple of 3.

For example, 3, 6, 9 or 12 second pixel circuits 22 are arranged at intervals between the 1st first light-emitting device and the 1st first pixel circuit.

Figure 13:
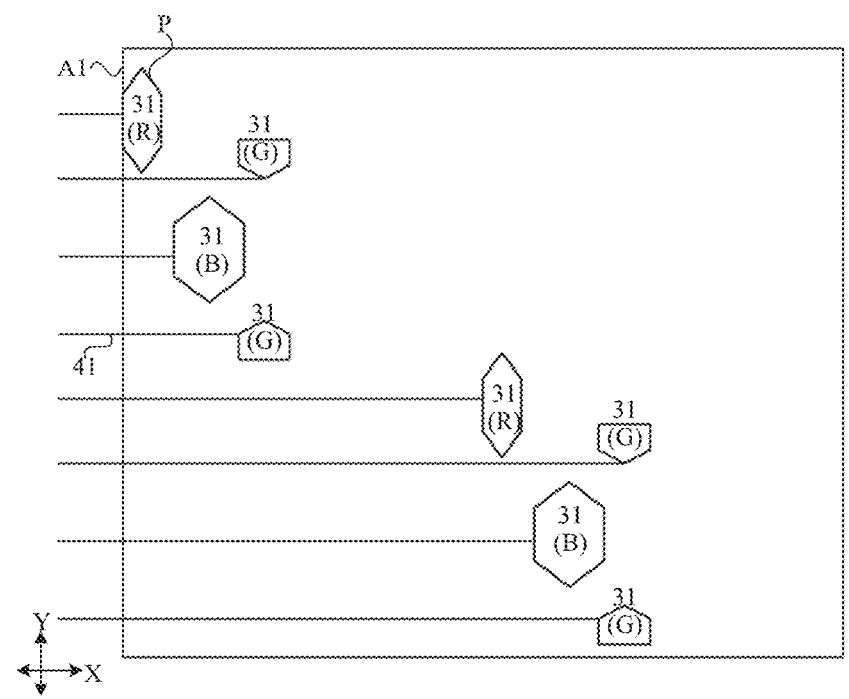
FIG. 13 is an enlarged partial view of yet another display substrate, in accordance with some embodiments of the present disclosure.

In some other examples, as shown in FIG. 13, the display substrate 100 includes a plurality of pixel units, and each pixel unit includes a plurality of sub-pixels P. The arrangement manner of the plurality of pixel units is a Pentile arrangement.

For example, the Pentile arrangement may refer to adding one sub-pixel on a basis of the RGB sub-pixels, so as to achieve RGBG sub-pixels arrangement, RGBW sub-pixels arrangement or RGBY sub-pixels arrangement. In addition, some sub-pixels P in the Pentile arrangement are each "shared", and thus a higher resolution than the actual resolution may be achieved on the visual effect. In the above contents, W represents a white sub-pixel, and Y represents a yellow sub-pixel. The number of sub-pixels P included in each pixel unit may be determined according to sharing situations, and is not limited in the embodiments of the present disclosure.

For example, Y second pixel circuits belonging to at least one pixel unit are arranged at interval between the 1st first light-emitting device and the 1st first pixel circuit, and Y is a multiple of 2.

For example, 2, 4, 6, or 8 second pixel circuits 22 are arranged at interval between the 1st first light-emitting device and the 1st first pixel circuit.

In some embodiments, as shown in FIGS. 10 and 11, a straight line extends in the second direction Y and passes through the first display region A1, and the straight line may be referred to as a reference line D-D'. The second direction Y is, for example, perpendicular to the first direction X.

A positional relationship among the first pixel circuit group 21*a*, the first light-emitting device group 31*a*, the lead group 41*a*, and the reference line D-D' included in the display substrate 100 varies, and may be set according to actual needs.

In some examples, the first pixel circuit group 21*a*, the first light-emitting device group 31*a* and the lead group 41*a* may all be located at a same side of the reference line D-D'.

In some other examples, as shown in FIGS. 10 and 11, the plurality of first light-emitting devices 31 located in the first display region A1 may be arranged in a plurality of rows in the second direction Y, and each row of first light-emitting devices 31 may include first light-emitting devices 31 arranged in sequence in the first direction X. Each row of first light-emitting devices may be divided into two first light-emitting device groups 31*a* located at two sides of the reference line D-D'.

Accordingly, two first pixel circuit groups 21*a* that are respectively electrically connected to the two first light-emitting device groups 31*a* located in the same row may be located at two opposite sides of the first display region A1 in the first direction X. In this case, the two first pixel circuit groups 21*a* are located at two sides of the reference line D-D'.

Accordingly, two lead groups 41*a* that are respectively electrically connected to the two first light-emitting device groups 31*a* located in the same row are located at two sides of the reference line D-D'.

The first pixel circuit groups 21*a*, the first light-emitting device groups 31*a*, and the lead groups 41*a* are arranged at two opposite sides of the reference line D-D'. Therefore, it may be possible to reduce the number of first pixel circuits 21 included in the first pixel circuit group 21*a*, reduce the number of first light-emitting devices 31 included in the first light-emitting device group 31*a*, and reduce the number of leads 41 included in the lead group 41*a*. This is not only beneficial to reducing the complexity of the routing path of the leads 41, but also reducing the pressure of the algorithm of external optical compensation (demura).

For example, as shown in FIGS. 10 and 11, the two lead groups 41*a* that are respectively electrically connected to the two first light-emitting device groups 31*a* are symmetrically arranged with respect to the reference line D-D'.

This is not only beneficial to further reducing the complexity of the routing path of the leads 41, but also making both the length variation laws and the parasitic capacitance variation laws of the two lead groups 41*a* the same. Thus, it may be possible to further reduce the pressure of the algorithm of external optical compensation (demura) and optimize the algorithm of external optical compensation (demura).

For example, as shown in FIGS. 10 and 11, the first display region A1 has a center O, and the reference line D-D' is a straight line passing through the center O.

In this way, the two first light-emitting groups 31*a* located in the same row include the same number of first light-emitting devices 31, so that the two corresponding first pixel circuit groups 21*a* include the same number of first pixel circuits 21, and the two corresponding lead groups 41*a* include the same number of leads 41. This is beneficial to reducing the pressure of the algorithm of external optical compensation (demura).

It can be understood that, the first light-emitting device 31 is electrically connected to a corresponding lead 41 through a transfer hole 5 (i.e., a via hole), so as to avoid the occurrence of short circuit.

Figure 14:
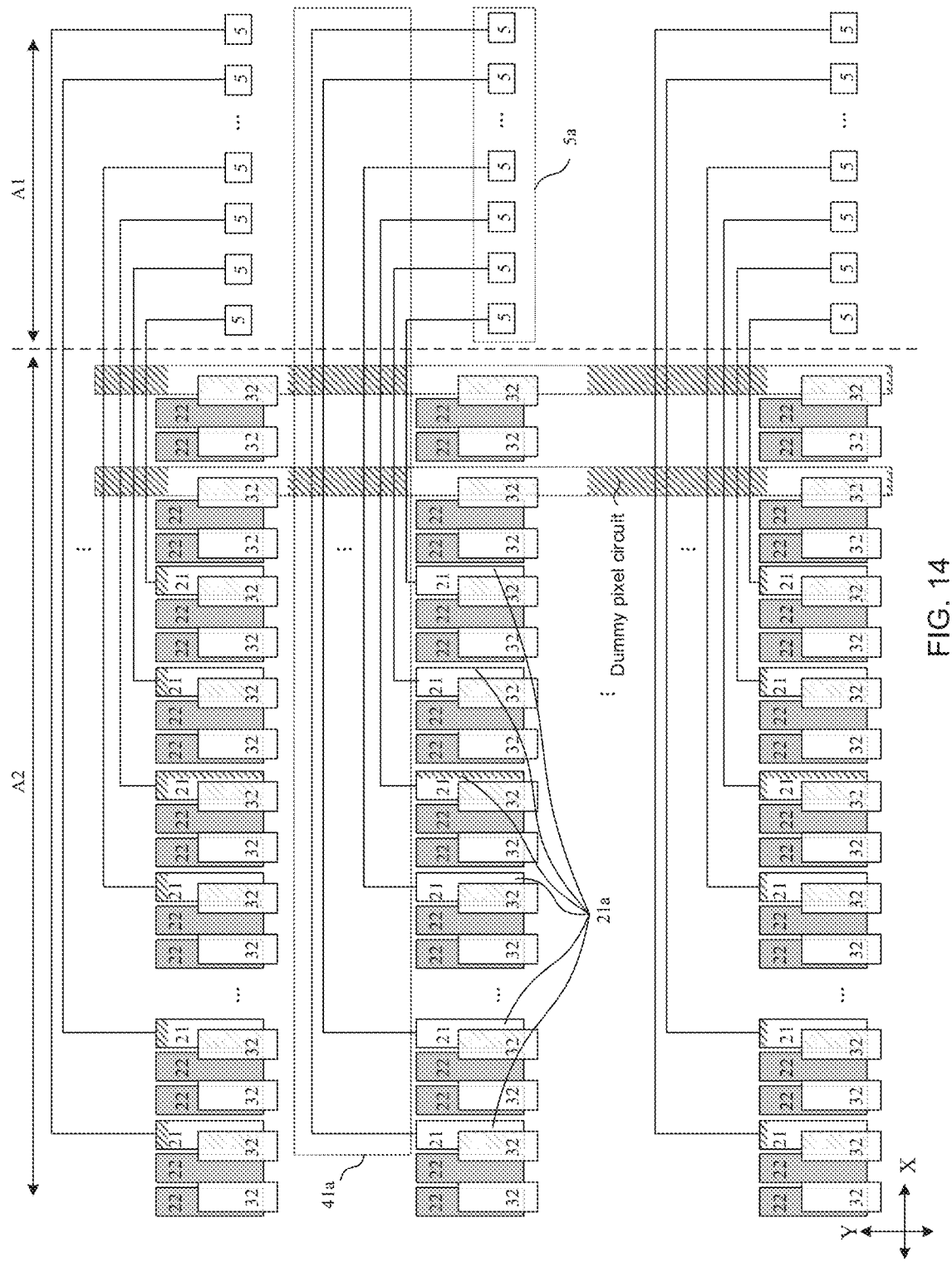
FIG. 14 is an enlarged partial view of yet another display substrate, in accordance with some embodiments of the present disclosure.
Figure 15:
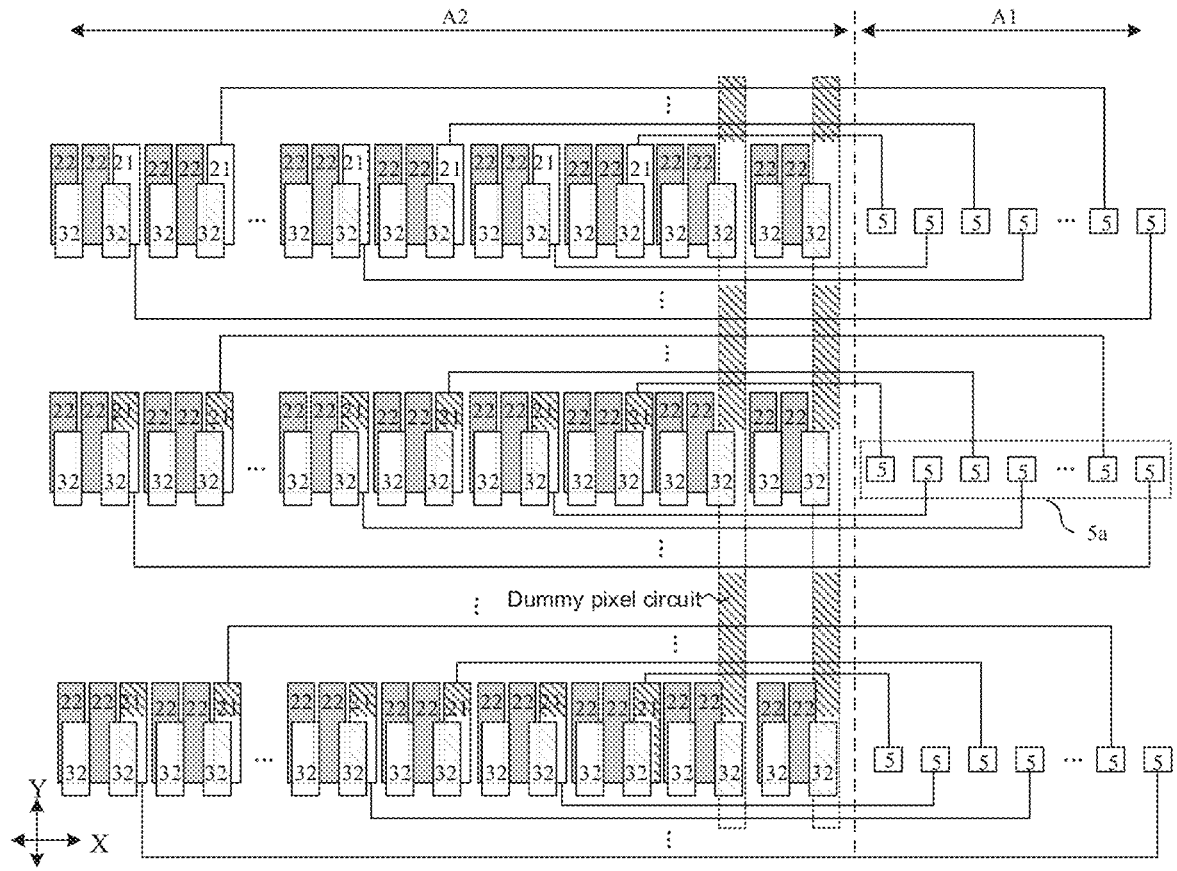
FIG. 15 is an enlarged partial view of yet another display substrate, in accordance with some embodiments of the present disclosure.

Based on this, in some examples, as shown in FIGS. 14 and 15, the display substrate 100 further includes transfer hole groups 5*a*. The transfer hole group 5*a* includes N transfer holes 5 arranged in sequence in the first direction X, and the N transfer holes 5 correspond to the N first light-emitting devices 31 in the first light-emitting device group 31*a* respectively.

For example, the N transfer holes 5 in the transfer hole group 5*a* are disposed in one-to-one correspondence with the N first light-emitting devices 31 in the first light-emitting device group 31*a*. Moreover, the N transfer holes 5 in the transfer hole group 5*a* are disposed in one-to-one correspondence with the N leads 41 in the lead group 41*a*. In this way, each first light-emitting device 31 may be electrically connected to a corresponding lead 41 through a corresponding transfer hole 5.

Optionally, a shape of an orthogonal projection of the transfer hole 5 on the substrate 1 may be set according to actual needs. For example, the shape of the orthogonal projection of the transfer hole 5 on the substrate 1 may be a circle or a square.

Here, a positional relationship between the N leads 41 in the lead group 41*a* and the transfer hole group 5*a* may vary. The following description will be made schematically by considering an example in which the first light-emitting device group 31*a* and the first pixel circuit group 21*a* electrically connected to the first light-emitting device group 31*a* are arranged in the same row in the first direction X.

For example, as shown in FIG. 14, in the second direction Y, the i-th lead electrically connected to the i-th first light-emitting device is closer to the transfer hole group 5*a* than the (i+1)-th lead electrically connected to the (i+1)-th first light-emitting device.

That is, the N leads 41 in the lead group 41*a* are located on a same side of the transfer hole group 5*a*, and the 1st, the 2nd, the 3rd, . . . , the (N−1)-th, and the N-th leads are away from the transfer hole group 5*a* in sequence in the second direction Y.

For example, as shown in FIG. 15, the i-th lead electrically connected to the i-th first light-emitting device and the (i+1)-th lead electrically connected to the (i+1)-th first light-emitting device are located at two opposite sides of the transfer hole group 5*a* in the second direction Y.

For example, in the lead group 41*a*, odd-numbered leads may be located at a side of the transfer hole group 5*a* in the second direction Y, and even-numbered leads may be located at another side of the transfer hole group 5*a* in the second direction Y.

In some embodiments, as shown in FIGS. 2 to 6, the display substrate 100 may further include a plurality of lead layers 4 disposed between the pixel circuit layer 2 and the light-emitting device layer 3. The plurality of lead layers 4 may be stacked in sequence in a direction perpendicular to the substrate 1. For example, the number of the lead layers 4 is two, three, or more.

It can be understood that, an insulating layer may be arranged between the pixel circuit layer 2 and the plurality of lead layers 4, an insulating layer may be arranged between any two adjacent lead layers 4, and an insulating layer may be arranged between the plurality of lead layers 4 and the light-emitting device layer 3. As shown in FIG. 4, the transfer hole groups 5*a* may be located in the insulating layer between the plurality of lead layers 4 and the light-emitting device layer 3. In FIG. 4, the light-emitting device layer 3 is represented by an anode.

In some examples, the N leads 41 in the lead group 41*a* are located in the plurality of lead layers 4.

For example, each lead layers 4 includes at least one of the N leads 41.

For example, as shown in FIGS. 4, 6, and 17, each lead layer 4 may further include a plurality of connection portions 42. The connection portion 42 may lead out the lead 41 electrically connected thereto to a layer where the connection portion 42 is located, so that the lead 41 may be electrically connected to a corresponding first light-emitting device 31 or a corresponding first pixel circuit 21.

For example, as shown in FIGS. 3 and 4, the number of the lead layers 4 is three. As shown in FIG. 4, in a direction perpendicular to and away from the substrate 1, the three lead layers 4 are a first lead layer 4*a*, a second lead layer 4*b*, and a third lead layer 4*c*.

As shown in FIG. 4, each second pixel circuit 22 may be electrically connected to a respective second light-emitting device 32 through a connection portion 42 located in the first lead layer 4*a*, a connection portion 42 located in the second lead layer 4*b*, and a connection portion 42 located in the third lead layer 4*c*. In FIG. 4, the second light-emitting device 32 is represented by the anode of the second light-emitting device 32, and the second pixel circuit 22 is represented by the second light-emitting control transistor T5 in the second pixel circuit 22.

For example, some first pixel circuits 21 may each be electrically connected to an end of the lead 41 located in the first lead layer 4*a*, and another end of the lead 41 may be electrically connected to a corresponding first light-emitting device 31 through the connection portion 42 located in the second lead layer 4*b* and the connection portion 42 located in the third lead layer 4*c* in sequence.

For example, some first pixel circuits 21 may each be electrically connected to an end of the lead 41 located in the second lead layer 4*b* through the connection portion 42 located in the first lead layer 4*a*, and another end of the lead 41 may be electrically connected to a corresponding first light-emitting device 31 through the connection portion 42 located in the third lead layer 4*c*.

For example, some first pixel circuits 21 may each be electrically connected to an end of the lead 41 located in the third lead layer 4*c* through the connection portion 42 located in the first lead layer 4*a* and the connection portion 42 located in the second lead layer 4*b*, and another end of the lead 41 may be electrically connected to a corresponding first light-emitting device 31.

For example, as shown in FIGS. 5 and 6, the number of the lead layers 4 is two. As shown in FIG. 6, in the direction perpendicular to and away from the substrate 1, the two lead layers 4 are a first lead layer 4*a* and a second lead layer 4*b*.

As shown in FIG. 6, each second pixel circuit 22 may be electrically connected to a respective second light-emitting device 32 through a connection portion 42 located in the first lead layer 4*a* and a connection portion 42 located in the second lead layer 4*b*. In FIG. 6, the second light-emitting device 32 is represented by the anode of the second light-emitting device 32, and the second pixel circuit 22 is represented by the second light-emitting control transistor T5 of the second pixel circuit 22.

For example, some first pixel circuits 21 may each be electrically connected to an end of the lead 41 located in the first lead layer 4*a*, and another end of the lead 41 may be electrically connected to a corresponding first light-emitting device 31 through the connection portion 42 located in the second lead layer 4*b*.

For example, some first pixel circuits 21 may each be electrically connected to an end of the lead 41 located in the second lead layer 4*b* through the connection portion 42 located in the first lead layer 4*a*, and another end of the lead 41 may be electrically connected to a corresponding first light-emitting device 31.

In some examples, a material of the plurality of lead layers 4 includes a light transmissive conductive material.

It can be understood that, the light transmissive conductive material has a high transmittance. The lead layer 4 is made of the light transmissive conductive material, so that the leads 41 located in the lead layer 4 have a high transmittance, and thus it may be possible to avoid shielding light passing through the portion of the display substrate 100 located in the first display region A1, and ensure that the portion of the display substrate 100 located in the first display region A1 has a high transmittance.

For example, the light transmissive conductive material includes at least one of indium tin oxide, indium zinc oxide, indium gallium zinc oxide, and other materials.

In some embodiments, as shown in FIGS. 3 to 6, the display substrate 100 further includes a transfer layer 6 disposed between the pixel circuit layer 2 and the plurality of lead layers 4. A material of the transfer layer 6 includes a metallic material.

For example, the material of the transfer layer 6 is the same as the material of the source-drain conductive layer, which may ensure that the transfer layer 6 has good electrical conductivity.

For example, the metallic material includes copper or aluminum.

In some examples, as shown in FIGS. 4 and 6, the transfer layer 6 is provided with a plurality of transfer portions 61 therein. The plurality of transfer portions 61 are disposed corresponding to (e.g., in one-to-one correspondence with) the plurality of first pixel circuits 21 and the plurality of second pixel circuits 22 included in the display substrate 100. Each transfer portion 61 may be connected to the second electrode of the second light-emitting control transistor T5 and the lead layer 4 closest to the substrate 1.

The provision of the transfer layer 6 may be beneficial to increasing a wiring space of the display substrate 100 and reducing the routing difficulty.

Figure 16:
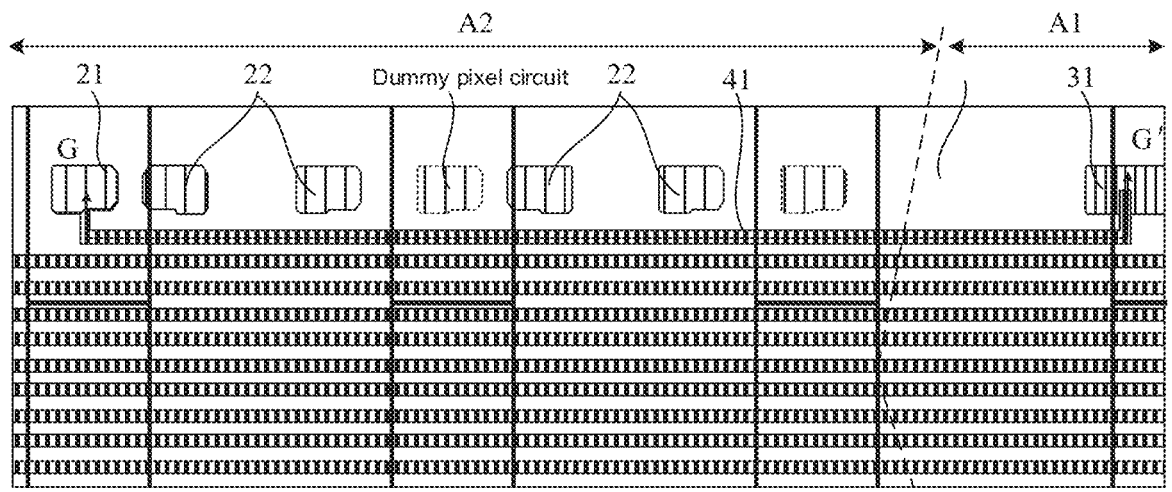
FIG. 16 is an enlarged partial view of yet another display substrate, in accordance with some embodiments of the present disclosure.

In FIG. 16, the dashed line in a form of broken line is a boundary between the first display region A1 and the second display region A2. The rightmost first light-emitting device 31 is the 1st first light-emitting device, and the leftmost first pixel circuit 21 is the 1st first pixel circuit. The lead 41 connecting the 1st first light-emitting device with the 1st first pixel circuit is the 1st lead. The first pixel circuit 21 is disposed in a region determined by the solid line in a shape of "H" in FIG. 16, and the second pixel circuit 22 is disposed in a region between two adjacent regions each determined by solid lines in a shape of "H". With respect to the dummy pixel circuit, reference may be made to the following description, and details are not provided here.

In some examples, as shown in FIG. 17, the number of the lead layers 4 included in the display substrate 100 is two. In the N leads 41 as described above, in the 1st to N-th leads, odd-numbered leads and even-numbered leads are respectively arranged in the two lead layers 4.

In this way, there is a large distance between any two adjacent leads 41 in leads 41 located in the same lead layer 4, so that the short circuit of the two adjacent leads 41 may be avoided, and the accuracy of the transmission of the driving signal may be ensured.

It will be noted that, the arrangement manner of the first pixel circuit 21 and the second pixel circuit 22 located in the second display region A2 varies, and may be set according to actual needs.

In some embodiments, as shown in FIG. 10, the second display region A2 includes normal regions A21b and compression regions A22b. The first pixel circuit group 21a is located in the compression region A22b, a part of second pixel circuits 22 in the plurality of second pixel circuits 22 are located in the normal regions A21b, and a remaining part of second pixel circuits 22 are located in the compression regions A22b. At least one second pixel circuit 22 is disposed between two adjacent first pixel circuits 21 in the first direction X in the compression region A22b. A width D1 or D2' of a column region in which the first pixel circuit 21 or the second pixel circuit 22 in the compression region A22b is located is less than a width D2 of a column region in which the second pixel circuit 22 in the normal region A21b is located.

For example, the width of the column region in which the first pixel circuit 21 is located refers to a dimension of a region occupied by a pixel circuit column in which the first pixel circuit 21 is located in the first direction X. The width of the column region in which the second pixel circuit 22 is located refers to a dimension of a region occupied by a pixel circuit column in which the second pixel circuit 22 is located in the first direction X.

The width of the column region in which the first pixel circuit 21 or the second pixel circuit 22 in the compression region A22b is located is less than the width of the column region in which the second pixel circuit 22 in the normal region A21b is located, which means that the width of the column region in which the first pixel circuit 21 or the second pixel circuit 22 in the compression region A22b is located is reduced, while the width of the column region in which the second pixel circuit 22 in the normal region A21b is located is not reduced.

By compressing the width of the column region in which the first pixel circuit 21 or the second pixel circuit 22 in the compression region A22b is located, it may be possible to spare space in the compression region A22b for arranging the first pixel circuits 21.

In some other embodiments, as shown in FIG. 11, the width of the column region in which the first pixel circuit 21 is located in the first direction X and the width of the column region in which the second pixel circuit 22 is located in the first direction X are both reduced.

This is beneficial to further increasing the space that the first pixel circuits 21 may be arranged, so that more first pixel circuits 21 may be placed in the second display region A2.

It will be noted that, the dummy pixel circuit shown in FIGS. 9, 14, 15 and 16 refers to that there is no pixel circuit provided in a region occupied by a rectangular pattern, and a width of the rectangular pattern in the first direction X is the same as the width of the column region in which the first pixel circuit 21 or the second pixel circuit 22 is located. This is beneficial to increasing the regularity of the arrangement of the second pixel circuits 22, and improving the regularity of the length variation of the leads 41.

Figure 18:
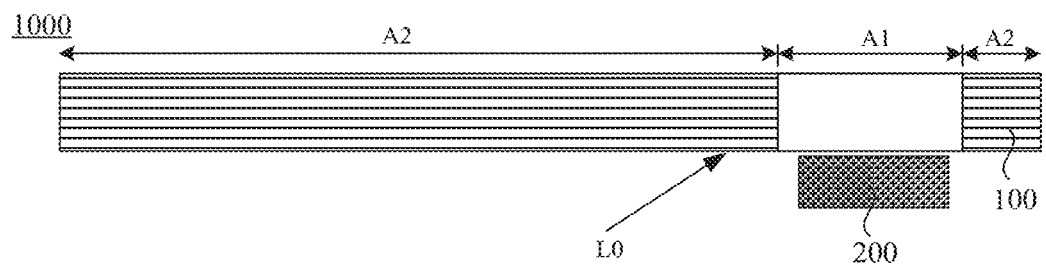
FIG. 18 is a structural diagram of a display apparatus, in accordance with some embodiments of the present disclosure.
Figure 19:
FIG. 19 is a structural diagram of another display apparatus, in accordance with some embodiments of the present disclosure.

Some embodiments of the present disclosure provide a display apparatus 1000. As shown in FIGS. 18 and 19, the display apparatus 1000 includes the display substrate 100 as described in any of the above embodiments, and optical element(s) 200 disposed on the non-light exit side L0 of the display substrate 100. The optical element(s) 200 are located under the first display region A1 of the display substrate 100.

In some examples, the optical element(s) 200 may include a photosensitive device. For example, the photosensitive device may include an image collector (e. g., a camera) or an infrared receiver.

Here, the number of the optical element(s) 200 may be set according to actual needs.

For example, in a case where the optical element 200 is disposed under the first display region A1 and on the non-light exit side of the display substrate 100, the external light may pass through the portion of the display substrate 100 located in the first display region A1 to be incident on the optical element 200, so as to make the optical element 200 operate.

For example, in a case where the optical element 200 does not operate, the portion of the display substrate 100 located in the first display region A1 may display, so that the display substrate 100 and the display apparatus 1000 may display images as a whole.

For example, in a case where the optical element 200 (e.g., the image collector) operates (e.g., a user takes a selfie), the first display region A1 may present a black image, the second display region A2 may present the selfie taken by the user, and a position where the image collector is located may be clearly shown. Alternatively, the whole of the first display region A1 and the second display region A2 present the selfie taken by the user, and the position where the image collector is located is not shown.

The beneficial effects of the display apparatus 1000 provided by some embodiments of the present disclosure may be the same as the beneficial effects of the display substrate 100 provided by some embodiments described above, and the details will not be repeated here.

In some examples, the display apparatus 1000 may further include a frame, and a circuit board, a display driver integrated circuit (IC) and other electronic elements that are disposed in the frame.

In some embodiments, the display apparatus 1000 may be any product or component with both a display function and an image acquisition function, such as a mobile phone, a tablet computer, a notebook computer, a laptop computer, a personal computer, a display, and a wearable device.

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a first display region and a second display region, and the second display region at least partially surrounding the first display region; the display substrate comprising:
    first light-emitting device groups disposed in the first display region, wherein a first light-emitting device group includes N first light-emitting devices; in a direction along a first direction and directed from the second display region to the first display region, the N first light-emitting devices are 1st to N-th first light-emitting devices;
    first pixel circuit groups disposed in the second display region, wherein a first pixel circuit group includes N first pixel circuits, and 1st to N-th first pixel circuits are disposed in sequence in a direction away from the first display region;
    lead groups, wherein a lead group includes N leads that are arranged in parallel, an i-th first light-emitting device is electrically connected to an i-th first pixel circuit through an i-th lead, and lengths of 1st to N-th leads increases; N is greater than or equal to 2 and is an integer, and i is equal to any of 1 to N; and
    a plurality of second pixel circuits disposed in the second display region, wherein the plurality of second pixel circuits are arranged in a plurality of columns in the first direction and in a plurality of rows in a second direction; the first direction intersects the second direction;
    wherein at least one line of second pixel circuits is disposed between the 1st first light-emitting device and the 1st first pixel circuit; the N leads extend from the first display region to the second display region passing through the at least one line of second pixel circuits; and the at least one line of second pixel circuits includes one of at least one row of second pixel circuits and at least one column of second pixel circuits.

2. The display substrate according to claim 1, wherein
    the first light-emitting device group and the first pixel circuit group electrically connected to the first light-emitting device group are disposed in a same row in the first direction;
    the at least one column of second pixel circuits is disposed between the 1st first light-emitting device and the 1st first pixel circuit; and
    the N leads extend from the first display region to the second display region passing through the at least one column of second pixel circuits in the first direction.

3. The display substrate according to claim 2, further comprising: a plurality of second light-emitting devices disposed in the second display region, wherein a second light-emitting device in the plurality of second light-emitting devices is electrically connected to at least one second pixel circuit in the plurality of second pixel circuits, and an orthogonal projection of the second light-emitting device on a plane where the display substrate is located at least partially overlaps with an orthogonal projection of the at least one second pixel circuit on the plane where the display substrate is located; or a second pixel circuit in the plurality of second pixel circuits is electrically connected to at least one second light-emitting device in the plurality of second light-emitting devices, and an orthogonal projection of the second pixel circuit on the plane where the display substrate is located at least partially overlaps with an orthogonal projection of the at least one second light-emitting device on the plane where the display substrate is located;
    the display substrate comprises a plurality of pixel units, each pixel unit includes three sub-pixels arranged in the first direction, and each sub-pixel includes a second light-emitting device and a second pixel circuit that are electrically connected to each other, wherein
    X second pixel circuits belonging to at least one pixel unit are disposed at intervals between the 1st first light-emitting device and the 1st first pixel circuit, and X is a multiple of 3.

4. The display substrate according to claim 2, further comprising: a plurality of second light-emitting devices disposed in the second display region, wherein a second light-emitting device in the plurality of second light-emitting devices is electrically connected to at least one second pixel circuit in the plurality of second pixel circuits, and an orthogonal projection of the second light-emitting device on a plane where the display substrate is located at least partially overlaps with an orthogonal projection of the at least one second pixel circuit on the plane where the display substrate is located; or a second pixel circuit in the plurality of second pixel circuits is electrically connected to at least one second light-emitting device in the plurality of second light-emitting devices, and an orthogonal projection of the second pixel circuit on the plane where the display substrate is located at least partially overlaps with an orthogonal projection of the at least one second light-emitting device on the plane where the display substrate is located;
    the display substrate comprises a plurality of pixel units, each pixel unit includes a plurality of sub-pixels, and each sub-pixel includes a second light-emitting device and a second pixel circuit that are electrically connected to each other; an arrangement manner of the plurality of pixel units is a Pentile arrangement, wherein Y second pixel circuits belonging to at least one pixel unit are disposed at intervals between the 1st first light-emitting device and the 1st first pixel circuit, and Y is a multiple of 2.

5. The display substrate according to claim 1, wherein a sequence constituted by values of lengths of the N leads in the first direction is an arithmetic sequence.

6. The display substrate according to claim 5, wherein a sequence constituted by values of resistances of the N leads is an arithmetic sequence.

7. The display substrate according to claim 5, wherein a parasitic capacitance is generated between each lead and at least one second pixel circuit through which the lead passes, or between each lead and at least one first pixel circuit through which the lead passes, or between each lead and both the at least one second pixel circuit and the at least one first pixel circuit through which the lead passes;

a sequence constituted by values of parasitic capacitances generated by the N leads is an arithmetic sequence.

8. The display substrate according to claim 1, wherein all first light-emitting devices located in the first display region constitute a plurality of rows of first light-emitting devices, each row of first light-emitting devices is divided into two first light-emitting device groups located at two sides of a reference line; the reference line is a straight line extending in the second direction and passing through the first display region, the second direction is perpendicular to the first direction;

two first pixel circuit groups respectively electrically connected to the two first light-emitting device groups are located at two opposite sides of the first display region in the first direction; and two lead groups respectively electrically connected to the two first light-emitting device groups are located at the two sides of the reference line.

9. The display substrate according to claim 8, wherein the two lead groups respectively electrically connected to the two first light-emitting device groups are symmetrically disposed with respect to the reference line.

10. The display substrate according to claim 8, wherein the first display region has a center, and the reference line is the straight line passing through the center.

11. The display substrate according to claim 1, wherein the first light-emitting device group and the first pixel circuit group electrically connected to the first light-emitting device group are disposed in a same row in the first direction;

the display substrate further comprises transfer hole groups, a transfer hole group includes N transfer holes, and the N transfer holes are arranged in sequence in the first direction and correspond to the N first light-emitting devices respectively; and in the second direction, the i-th lead electrically connected to the i-th first light-emitting device is closer to the transfer hole group than an (i+1)-th lead electrically connected to an (i+1)-th first light-emitting device; and the second direction is perpendicular to the first direction.

12. The display substrate according to claim 1, wherein the first light-emitting device group and the first pixel circuit group electrically connected to the first light-emitting device group are disposed in a same row in the first direction;

the display substrate further comprises transfer hole groups, a transfer hole group includes N transfer holes, and the N transfer holes are arranged in sequence in the first direction and correspond to the N first light-emitting devices; and the i-th lead electrically connected to the i-th first light-emitting device and an (i+1)-th lead electrically connected to an (i+1)-th first light-emitting device are located at two opposite sides of the transfer hole group in the second direction; and the second direction is perpendicular to the first direction.

13. The display substrate according to claim 1, wherein the display substrate comprises:

a substrate;

a pixel circuit layer disposed on the substrate, the first pixel circuit groups and the plurality of second pixel circuits being located in the pixel circuit layer;

a light-emitting device layer disposed at a side of the pixel circuit layer away from the substrate, the first light-emitting device groups being located in the light-emitting device layer; and a plurality of lead layers disposed between the pixel circuit layer and the light-emitting device layer, a material of the plurality of lead layers including a light transmissive conductive material, wherein the N leads in the lead group are located in the plurality of lead layers.

14. The display substrate according to claim 13, wherein a number of the plurality of lead layers is two;

in the 1st to N-th leads in the N leads, odd-numbered leads and even-numbered leads are respectively arranged in the two lead layers.

15. The display substrate according to claim 1, wherein in the N leads, a ratio of a length of the N-th lead to a length of the 1st lead is $\alpha$, and $\alpha$ is less than or equal to 25 ($\alpha \leq 25$).

16. The display substrate according to claim 15, wherein the ratio $\alpha$ satisfies that a is less than or equal to 15 ($\alpha \leq 15$).

17. The display substrate according to claim 1, wherein a number of rows or columns of second pixel circuits disposed at intervals between the 1st first light-emitting device and the 1st first pixel circuit is $\beta$, and $\beta$ is less than or equal to 30 ($\beta \leq 30$).

18. The display substrate according to claim 1, wherein a ratio of a number of rows or columns of pixel circuits disposed at intervals between the N-th first light-emitting device and the N-th first pixel circuit to a number of rows or columns of second pixel circuits disposed at intervals between the 1st first light-emitting device and the 1st first pixel circuit is $\gamma$, and $\gamma$ is greater than or equal to 5 and less than or equal to 50 ($5 \leq \gamma \leq 50$); the pixel circuits disposed between the N-th first light-emitting device and the N-th first pixel circuit include first pixel circuits and second pixel circuits.

19. The display substrate according to claim 1, wherein the second display region includes a normal region and a compression region; the first pixel circuit groups are located in the compression region, a part of the plurality of second pixel circuits are located in the normal region, and a remaining part of the plurality of second pixel circuits are located in the compression region; in the compression region, at least one second pixel circuit is disposed between two adjacent first pixel circuits in the first direction; and a width of a column region in which a first pixel circuit or a second pixel circuit in the compression region is located is less than a width of a column region in which a second pixel circuit in the normal region is located.

20. A display apparatus, comprising:

the display substrate according to claim 1; and an optical element disposed on a non-light exit side of the display substrate, the optical element being located under the first display region of the display substrate.

* * * * *